United States Patent
Horikoshi et al.

(10) Patent No.: US 6,813,004 B1
(45) Date of Patent: Nov. 2, 2004

(54) EXPOSURE METHOD, EXPOSURE APPARATUS AND MAKING METHOD OF THE APPARATUS, AND DEVICE AND MANUFACTURING METHOD OF THE DEVICE

(75) Inventors: Takahiro Horikoshi, Chofu (JP); Takahisa Kikuchi, Tokyo (JP); Masahiro Nei, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/680,513

(22) Filed: Oct. 6, 2000

Related U.S. Application Data

(63) Continuation of application No. PCT/JP99/01802, filed on Apr. 6, 1999.

(30) Foreign Application Priority Data

Apr. 7, 1998 (JP) .......................................... 10-111406
Apr. 20, 1998 (JP) .......................................... 10-125272

(51) Int. Cl.$^7$ ........................ G03B 27/72; G03B 27/32; A61N 5/00; G01B 11/00; G03C 5/00
(52) U.S. Cl. .......................... 355/69; 355/35; 355/67; 355/77; 250/492.2; 356/400; 430/30; 430/311
(58) Field of Search ............................. 355/35, 67, 68, 355/69, 77; 250/492.2; 356/400; 430/30, 311

(56) References Cited

U.S. PATENT DOCUMENTS

| | | | |
|---|---|---|---|
| 4,701,606 A | * 10/1987 | Tanimoto et al. | |
| 5,602,683 A | 2/1997 | Straaijer et al. | |
| 5,677,757 A | * 10/1997 | Taniguchi | .................... 355/71 |
| 5,699,183 A | * 12/1997 | Hiraiwa et al. | ............. 359/355 |
| 5,721,608 A | * 2/1998 | Taniguchi | ..................... 355/53 |
| 5,841,520 A | * 11/1998 | Taniguchi | ..................... 355/53 |
| 5,861,944 A | * 1/1999 | Nishi | .......................... 355/68 |
| 5,892,573 A | 4/1999 | Takahashi et al. | |
| 5,894,341 A | * 4/1999 | Nishi et al. | |
| 5,898,477 A | 4/1999 | Yoshimura et al. | |
| 6,163,365 A | * 12/2000 | Takahashi | |

FOREIGN PATENT DOCUMENTS

| | | |
|---|---|---|
| EP | 0 874 283 A2 | 4/1998 |
| JP | 5-343288 | 12/1993 |
| JP | 6-204113 | 7/1994 |
| JP | 9-63948 | 3/1997 |
| JP | 9-320932 | 12/1997 |
| JP | 10-116766 | 5/1998 |
| JP | PCT/JP98/02536 | 9/1998 |
| WO | WO 99/05710 | 2/1999 |

* cited by examiner

*Primary Examiner*—Frank G. Font
*Assistant Examiner*—Khaled Brown
(74) *Attorney, Agent, or Firm*—Oblon, Spivak, McClelland, Maier & Neustadt, P.C.

(57) ABSTRACT

A main controller sets an exposure control target value according to the transmittance of an optical system measured by means of a sensor prior to exposure or estimated by predetermined calculation, and exposure is controlled according to the set exposure control target value while a reticle pattern is being transferred onto a wafer through the optical system. Since the exposure energy provided to the image surface changes in a unit time per unit area in accordance with the transmittance of the optical system, the exposure control target value is set according to the transmittance of the optical system, and exposure is controlled according to the set control target value. Thus, exposure with a high precision is achieved without being influenced by the variation of the transmittance.

51 Claims, 9 Drawing Sheets

2

EXPOSURE METHOD, EXPOSURE APPARATUS AND MAKING METHOD OF THE APPARATUS, AND DEVICE AND MANUFACTURING METHOD OF THE DEVICE

CROSS-REFERENCE TO RELATED APPLICATIONS

This is a continuation of International Application PCT/JP99/01802, with an international filing date of Apr. 6, 1999, the entire content of which is hereby incorporated by reference.

BACKGROUND OF THE INVENTION

1. Field of the Invention

The present invention relates to an exposure method, an exposure apparatus and making method of the apparatus, and device and manufacturing method of the device. More particularly, the present invention relates to an exposure apparatus used in a photolithographic process in manufacturing a semiconductor device, liquid crystal display device, or the like and its making method, an exposure method using the exposure apparatus, a device manufacturing method using the exposure method and a device manufactured by the exposure apparatus.

2. Description of the Related Art

In a photolithographic process to manufacture a semiconductor device, liquid crystal display device, or the like, conventionally, a projection exposure apparatus such as a reduction projection exposure apparatus based on a step-and-repeat method (so-called stepper) or a scanning exposure apparatus based on a step-and-scan method (so-called scanning stepper) which is an improvement of the stepper is used.

The resolution of a projection optical system of a projection exposure apparatus of this type is expressed by the frequently cited Rayleigh criterion, $R=k\times\lambda/N.A.$ In this case, R is the resolution of the projection optical system, $\lambda$ is the wavelength of exposure light, N.A. is the numerical aperture of the projection optical system, and k is the constant determined by the process as well as the resolution of the resist.

As the integration degree of semiconductor devices increases, a higher resolution is required for the projection optical system. In order to satisfy this demand, as is obvious from the equation above, efforts have been made to decrease the wavelength of exposure light or increase the numerical aperture of the projection optical system, i.e., to increase the N.A. In recent years, an exposure apparatus having a projection optical system with a numeral aperture of 0.6 or more and using krypton fluoride excimer laser (KrF excimer laser) with an output wavelength of 248 nm as an exposure light source has been put into practice, thus achieving exposure with a device rule (practical minimum line width) of 0.25 $\mu$m.

In the conventional projection exposure apparatus described above, exposure amount control has been performed on the premise that the transmittance of the optical system does not change upon irradiation of exposure light. That is, the amount of exposure light irradiated on a reticle is measured by a light amount monitor (called an integrator sensor) arranged in the illumination optical system before the exposure light passes through the optical system. The amount of exposure light is also measured after the exposure light passes through the reticle and projection optical system by a light amount monitor, e.g., an illuminometer arranged on the wafer stage. The ratio between the output of the integrator sensor and the illuminometer is then calculated prior to exposure. And on exposure, by using the calculated ratio, the illuminance on the wafer surface (image plane) is estimated from the output value of the integrator sensor, and the exposure amount is feedback-controlled so that the illuminance on the image plane is determined at a desired As a light source succeeding the krypton fluoride excimer laser, an argon fluoride excimer laser (ArF excimer laser) having an output wavelength of 193 nm is beginning to receive attention. If an exposure apparatus using this argon fluoride excimer laser as an exposure light source is put into practice, microdevices having fine patterns with a device rule of 0.18 $\mu$m to 0.13 $\mu$m can be expected to be mass-produced. Therefore, research and development on this technique have been vigorously conducted.

However, with exposure apparatus using an ArF excimer laser as an exposure light source, it was discovered that the transmittance of optical systems (illumination optical system and projection optical system) did change upon irradiation of exposure light at a level in which such changes cannot be neglected. According to recent researches, characteristics have been confirmed that the transmittance of an optical system gradually increases after starting irradiation of exposure light, and saturates when it comes to a certain level.

It is assumed that such changes occur due to a cleaning effect, i.e., removal of moisture and organic material from the surface of optical elements such as lenses and reflecting mirrors upon irradiation of ArF excimer laser light. Such a cleaning effect is also assumed to have occurred in the case of a KrF excimer laser light. With the case of an ArF excimer laser light, however, since the transmittance to substances such as water is low, the transmittance differs greatly when there are drops of water compared with the case when there are no drops of water. In the case of KrF excimer laser light, the difference is not very large, thus does not pose any serious problems.

Accordingly, the conventional exposure amount control method, based on the assumption that the transmittance of optical systems does not change upon irradiation of exposure light, now requires some kind of a modification.

SUMMARY OF THE INVENTION

The present invention has been made in consideration of this situation, and has as its first object to provide an exposure method, which can implement high-precision exposure without being influenced by variations in the transmittance of an optical system.

It is the second object of the present invention to provide an exposure apparatus, which can perform a highly precise exposure without being influenced by the variation in the transmittance of an optical system.

According to the first aspect of the present invention, there is provided a first exposure method performed by an exposure apparatus which has an optical system to transfer a pattern illuminated with exposure light from a light source onto a substrate, the method comprising: setting an exposure amount control target value in accordance with a transmittance of the optical system; and transferring the pattern onto the substrate through the optical system while an exposure amount is controlled based on the set exposure amount control target value.

In this case, an exposure amount control target value is "not a target exposure amount to be provided to an image plane (substrate surface) which is determined in accordance with the sensitivity of a resist coated on a substrate, but is the target value of an exposure amount which is to be controlled in order to provide the target exposure amount to the image plane". In this specification, the term "exposure amount control target value" is used in this sense.

According to this method, an exposure amount control target value is set in accordance with the transmittance of the optical system, and a pattern is transferred onto the substrate through the optical system while the exposure amount is controlled based on the set exposure amount control target value. That is, the exposure energy tone supplied to the image plane by unit area per unit time changes in accordance with the transmittance of the optical system. Therefore, as in the present invention, if an exposure amount control target value is set in accordance with the transmittance of the optical system and exposure is performed with the set exposure amount; highly precise exposure which is free from the influence of transmittance variations can be performed.

As a countermeasure for transmittance variations, the changes in transmittance can be measured in advance under the same illumination conditions as that of actual exposure, to obtain a transmittance time-varying curve. And on exposure, an elapsed time from the starting of irradiation and the period of time when the apparatus was not operating are measured with a timer. Then by using the time data and the transmittance time-varying curve, the transmittance can be estimated by calculation. By the calculation and an output from the light amount monitor arranged in the illumination optical system, the illuminance on the image plane is estimated, and the exposure amount can be controlled so as to set the illuminance on the image plane at a desired value. This method, however, requires a complicated preliminary measurement to obtain the transmittance time-varying curve, and in addition, the value estimated by calculation does not always coincide with the actual transmittance.

In the first exposure method according to the present invention, when the exposure amount control target value is set the transmittance of the optical system is a base to set the exposure amount control target value, and the transmittance can be actually measured at a predetermined measurement interval. In such a case, transmittance measurement is performed at a predetermined measurement interval. And until the next transmittance measurement is performed, the exposure amount control target value is set in accordance with a previously measured transmittance and the exposure amount is controlled based on the target value. Thus, the pattern illuminated with exposure light from the light source is transferred onto the substrate through the optical system. Accordingly, the complicated preliminary measurement described above is not required. In addition, since the exposure amount control target value is set according to the transmittance actually measured, and the exposure amount is controlled based on the target value, exposure with high precision can be performed. And as a result, the illuminance of the substrate surface (image plane illuminance) is always set at a desired (appropriate) value.

The transmittance of the optical system varies in different ways depending on the exposure condition. In consideration of this, in the first exposure method according to the present invention, the measurement interval is preferably set in accordance with an exposure condition. In such a case, the measurement intervals of the transmittance of the optical system are set in accordance with the exposure condition, and transmittance measurement is performed at the set measurement interval. And until the next transmittance measurement is performed, the exposure amount control target value is set in accordance with a previously measured transmittance and the exposure amount is controlled based on the target value. Thus, the pattern illuminated with exposure light from the light source is transferred onto the substrate through the optical system. According to the present invention, therefore, regardless of the exposure condition, exposure with high precision can be performed while the illuminance of the substrate surface (image plane illuminance) is always set at a desired (appropriate) value. In this case as well, the complicated preliminary measurement all described above, is not required.

The exposure condition is a condition serving as a reference for setting measurement intervals of the transmittance of the optical system. This exposure condition includes all conditions that influence the transmittance of the optical system. For example, the exposure condition may include a transmittance of a mask. Alternatively, the exposure condition may include one of a minimum line width and a permissible exposure amount error.

In the first exposure method according to the present invention, when the transmittance of the optical system, which serves as a reference for setting an exposure amount control target value, is actually measured at predetermined measurement intervals, the measurement interval may be changed in accordance with a variation amount between a transmittance obtained by a most recent transmittance measurement and a transmittance obtained by a measurement performed before the most recent measurement. In such a case, in accordance with the variation amount between the transmittance obtained by the most recent transmittance measurement and the transmittance obtained by a measurement performed before the most recent measurement, the measurement intervals are changed for subsequent transmittance measurements. Accordingly, short transmittance measurement intervals are set when the rate of change in transmittance is large and the transmittance needs to be frequently measured, whereas long transmittance measurement intervals are set when the rate of change in transmittance is small. This allows highly precise exposure amount control, without unnecessarily decreasing the throughput.

The inventors of the present invention analyzed the transmittance varying curves obtained by various experiments and discovered a predetermined relationship. The relationship exists between the transmittance time-varying of the optical system on exposure performed by an exposure apparatus using ArF excimer laser light (or illumination light having a shorter wavelength) as a light source, and the irradiation history of exposure light since the time when the apparatus was not operating.

In the first exposure method according to the present invention, the setting the exposure amount control target value may include a prediction function determining to determine a transmittance time-varying prediction function for the optical system in accordance with an irradiation history of exposure light on the optical system, and setting the exposure amount control target value based on the determined transmittance time-varying prediction function.

According to this method, a transmittance time-varying prediction function of the optical system is determined in accordance with the irradiation history of exposure light on the optical system, and an exposure amount control target value is set based on the determined transmittance time-varying prediction function. When transferring a pattern, the exposure amount is controlled based on the exposure amount control target value. Therefore, accurate exposure amount control (predictive control) can be performed in accordance with the transmittance predicted based on the transmittance time-varying prediction function. As a consequence, the image plane illuminance (substrate surface illuminance) can always be set at an almost desired value without unnecessarily decreasing the throughput.

The irradiation history of exposure light on the optical system is considered in the prediction function determining, because, as described above, the inventors found out in research that the rate of change (variation rate) in the transmittance of the optical system is dependent on the irradiation history of exposure light on the optical system. Accordingly, the transmittance time-varying prediction function in the present invention indicates an algebraic expression including a parameter dependent on the irradiation history of exposure light on the optical system.

The time-varying function can use a function expressed by $$T = a \cdot \exp\left(\sum_{i=1}^{k} b_i t\right) \quad (1)$$

in which T is the transmittance of the optical system, a is a parameter representing a rate of change in the transmittance, and $b_i$ is a parameter dependent on each exposure condition including an illumination condition.

The first exposure method according to the present invention can further comprise prior to the prediction function determining: measuring a period of time in which the exposure apparatus most recently stops operation; measuring an irradiation time of exposure light on the optical system in a self-cleaning operation which is performed after the exposure apparatus most recently stops operation; measuring an exposure light intensity; and measuring an irradiation amount.

In this specification, "self-cleaning" means a break-in to be performed after the start of the operation of the apparatus. While the operation of the apparatus is stopped, the surfaces of lens elements (the surfaces of optical thin films) configuring the optical system are contaminated with contaminants (organic substances and moisture). When performing a break-in, however, the optical system is irradiated with exposure light to produce the effect of gradually remove the contaminants from the surface of the lens elements (cleaning effect). So, naturally, as to distinguish this operation from the cleaning effect also evident during exposure, the operation is not referred to simply as cleaning.

The irradiation history is determined in accordance with the above respective physical quantities during when the apparatus not operating, and when actual exposure on the substrate starts. Therefore, an accurate exposure amount prediction function can be determined by obtaining the irradiation history. And the irradiation history can be obtained by actually measuring a period of time in which the exposure apparatus most recently stops operation; measuring an irradiation time of exposure light on the optical system in a self-cleaning operation which is performed after the exposure apparatus most recently stops operation; measuring an exposure light intensity; and measuring an irradiation amount.

In the first exposure method according to the present e invention, it is more preferable that the environmental conditions for the optical system is measured at a cl, predetermined time interval, and the environmental conditions are considered when transmittance time-varying prediction function is determined. This is because by the research of the inventors of the present invention, it has been discovered that the environmental conditions such as the temperature and humidity in the chamber where the exposure apparatus body is housed, and the atmospheric pressure and $CO_2$ concentration in the lens chamber in the optical system, e.g., a projection optical system, affect the rate of change of the transmittance of the optical system.

In the first exposure method according to the present invention, the method may further comprise: measuring a transmittance of the optical system at a predetermined interval, and can correct the transmittance time-varying prediction function each time a transmittance measurement is performed. This is because it is difficult to accurately and completely predict the transmittance time-varying of the optical system. Therefore, to allow a more accurate exposure amount control, the changes in transmittance are measured at a predetermined interval, and the errors in the predictive values of exposure amounts are also corrected in the predetermined interval.

In this case, it is preferable that the predetermined interval of the measuring the transmittance is determined in respect to a relationship with a required exposure precision. In such a case, when a required exposure precision is extremely high, the measurement intervals are shortened to correct a transmittance time-varying prediction function at shorter intervals, as a result, further reducing an error in the calculated predictive value of transmittance. In contrast to this, when a required exposure precision is low, to prevent an unnecessary decrease in throughput, the measurement interval is prolonged.

Also, since the transmittance varies in different manners (rate of change), the interval of the measuring the transmittance may be shortened when a rate of change in the transmittance of the optical system is large, and prolonged when the rate of change in the transmittance of the optical system is small. This makes it possible to prevent an unexpected decrease in throughput while maintaining a highly precise exposure amount control.

According to the second aspect of the present invention, there is provided a second exposure method to transfer a pattern illuminated with exposure light from a light source onto a substrate through an optical system, the method comprising: setting measurement intervals in accordance with an exposure condition; and measuring a variation in the amount of the exposure light passing through the optical system in the set measurement intervals.

In this case, the exposure condition may include at least one of an illumination condition to illuminate a mask, a transmittance of the mask, a minimum line width, and a permissible exposure amount error.

According to the third aspect of the present invention, there is provided a third exposure method to transfer a pattern illuminated with exposure light from a light source onto a substrate through an optical system, the method comprising: measuring a variation in the amount of the exposure light passing through the optical system in a predetermined measurement interval; and changing the predetermined measurement intervals upon the measuring, in accordance with a comparison result of a variation of a first measurement of the light amount and a variation of a second measurement of the light amount.

In this case, the first and second measurements may be performed prior to starting of exposure. Alternatively, the first and second measurements may be performed after starting of exposure.

According to the fourth aspect of the present invention, there is provided a fourth exposure method performed by an exposure apparatus to transfer a pattern illuminated from a light source with exposure light through an optical system onto a substrate, the method comprising: a self-cleaning to clean the optical system by irradiating the optical system with the exposure light on a predetermined condition prior to exposure; a prediction function determining to determine a transmittance time-varying prediction function of the optical system in consideration of the predetermined condition; and setting the exposure amount control target value based on the determined transmittance time-varying in prediction function.

In this case, the prediction function determining can take into consideration the period of time in which the operation of the apparatus is stopped. The predetermined condition may also include an irradiation time of the exposure light on the optical system, the exposure light intensity, and an irradiation amount.

According to the fifth aspect of the present invention, there is provided a fifth exposure method to transfer a pattern illuminated from a light source with exposure light through an optical system onto a substrate, the method comprising: setting a measurement interval in accordance with an exposure condition; and measuring an amount of the exposure light passing through the optical system in the measurement interval.

In this case, the method can further comprise: obtaining a transmittance of the optical system in accordance with an amount of the exposure light which is measured before passing through the optical system, and the measurement result of the exposure light passing through the optical system.

According to the sixth aspect of the present invention, there is provided a first exposure apparatus to transfer a pattern illuminated with exposure light from a light source onto a substrate through an optical system, the exposure apparatus comprising: an exposure amount setting unit to set an exposure amount control target value in accordance with a transmittance of the optical system; and an exposure amount control system connected with the exposure amount setting unit to control an exposure amount based on the set exposure amount control target value.

According to this apparatus, the exposure amount setting unit sets an exposure amount control target value in accordance F with the transmittance of the optical system. The exposure amount control system controls the exposure amount based on the set exposure amount control target value during transfer of a pattern onto the substrate through the optical system (i.e., during exposure). As described above, exposure energy provided to a unit area per unit time in an image plane changes in accordance with the transmittance of the optical system. If, as in the present invention, the exposure amount control target value is set in accordance with the transmittance of the optical system, and the exposure amount is controlled based on the target value, the illuminance of a substrate surface (image plane illuminance) can always be set at a desired (appropriate) value. Thus, exposure with high precision can be achieved.

In the first exposure apparatus according to the present invention, when the apparatus further comprises; a transmittance measurement unit which measures a transmittance of the optical system, the exposure amount setting unit can set the exposure amount control target value in accordance with the transmittance measured by the transmittance measurement unit. In such a case, the transmittance measurement unit measures the transmittance of the optical system, and the exposure amount setting unit sets an exposure amount control target value in accordance with the measured transmittance. When transferring a pattern, the exposure amount control system controls the exposure amount based on the set exposure amount control target value. Accordingly, any complicated preliminary measurement, as when performed to obtain the transmittance time-varying curve is not required. In addition, since the exposure amount is controlled based on the exposure amount control target value set by the transmittance actually measured, exposure with high precision can be performed while the illuminance of a substrate surface (image plane illuminance) is always set at a desired (appropriate) value.

In this case, the transmittance measurement unit may perform the transmittance measurement at a predetermined measurement interval. In such a case, the transmittance measurement unit performs transmittance measurement at a predetermined measurement interval. Until the next transmittance measurement, the exposure amount control target value is set by the exposure amount setting unit in accordance with the transmittance most recently measured, and during exposure, the exposure amount control system controls the exposure amount based on the set exposure amount control target value. Accordingly, the complicated preliminary measurement is not required. In addition, the exposure amount control target value is set according to the transmittance actually measured, and the exposure amount is controlled based on the set exposure amount control target value. And, each time the transmittance is re-measured, the exposure amount target value is updated and set in accordance with the renewed transmittance, and the exposure amount is controlled based on the updated exposure amount control target value. Therefore, the illuminance of the substrate surface (image plane illuminance) can always be set at a desired (appropriate) value, while reducing the influence of transmittance variation, thereby making it possible to perform exposure with high precision.

The transmittance of the optical system varies in different manners depending on the exposure condition. In consideration of this, the first exposure apparatus according to the present invention preferably further comprises: a control unit to set the measurement interval of the transmittance measurement unit in accordance with an exposure condition. In such a case, the control unit sets the measurement interval of the transmittance of the optical system in accordance with the exposure conditions, and the transmittance measurement unit performs transmittance measurement at the set measurement interval. Until the next transmittance measurement, the exposure amount control target value is set by the exposure amount setting unit in accordance with the transmittance most recently measured. And when a pattern is transferred onto the substrate through the optical system, the exposure amount is controlled by the exposure amount control system based on the set exposure,amount control target value. If the exposure conditions are changed while exposure is performed, the control unit updates and sets the measurement interval of the transmittance measurement unit in accordance with the exposure conditions after the change. Subsequently, transmittance measurement is performed at the measurement intervals after the change. Accordingly, if the exposure conditions are likely to cause large transmittance variations, short transmittance measurement intervals can be set, and if exposure conditions are likely to cause moderate transmittance variations, long transmittance measurement intervals can be set. Therefore, exposure with high precision can be performed regardless of changes in exposure conditions, without being influenced by transmittance variations, and without unnecessarily decreasing the throughput. In this case as well, the complicated preliminary measurement is not required.

In the case the first exposure apparatus according to the present invention includes a control unit to set measurement intervals of the transmittance measurement unit in accordance with exposure conditions, when the apparatus further comprises: an information reading unit to read information of a mask on which the pattern is formed, the control unit may automatically determine measurement intervals for the transmittance measurement unit based on the information of the mask read by the information reading unit.

The first exposure apparatus according to the present invention may further comprise: a control unit connected with the transmittance measurement unit to set the transmittance measurement interval of the transmittance measurement unit in accordance with a variation amount between a transmittance obtained by a most recent transmittance measurement and a transmittance obtained by a measurement performed before the most recent measurement, the respective measurement performed by the transmittance measurement unit. In such a case, the control unit sets the transmittance measurement intervals of the transmittance measurement unit in accordance with the variation amount between a transmittance obtained by a most recent transmittance measurement and a transmittance obtained by a measurement performed before the most recent measurement. Therefore, in the case the rate of change in transmittance is high and transmittance measurement must be frequently performed, short transmittance measurement intervals are set. And, in then case the rate of change in transmittance is low, long transmittance measurement intervals are set, thus, allowing exposure with high precision without unnecessarily decreasing the throughput.

In this case, two sequential measurements of transmittance by the transmittance measurement unit can be performed prior to starting of exposure. Alternatively, two sequential measurements of transmittance by the transmittance measurement unit can be performed after starting of exposure. In the former case, the transmittance measurement interval can be automatically set in accordance with the transmittance of the optical system prior to exposure. In the latter case, as described above, the transmittance measurement interval can be automatically set so that the transmittance measurement interval is short when the rate of change in transmittance is high, and transmittance measurement interval is long when the rate of change in transmittance is low, after the exposure starts.

In the first exposure apparatus according to the present invention, the transmittance measurement unit may include, for example, a first optical sensor disposed in a light path of the exposure light to detect the amount of exposure light irradiated on the pattern, a second optical sensor arranged to be substantially flush with the substrate, and a control unit connected with the first optical sensor and the second optical sensor to detect the amount of exposure light passing through the optical system by using the second optical sensor at a timing which corresponds to an exposure condition, and to obtain a transmittance of the optical system based on the amount of exposure light and an output from the first optical sensor.

In such a case, when it becomes a predetermined timing corresponding to the exposure condition, the control unit detects the amount of light having passed through the optical system using the second optical sensor arranged to be almost flush with the substrate. It then obtains the transmittance of the optical system based on the light amount and the output from the first optical sensor. The exposure amount setting unit then sets (updates) the exposure amount control target value in accordance with the measured (obtained) transmittance. The exposure amount during the transfer of the pattern is controlled based on the updated exposure amount control target value by the exposure amount control system. This makes it possible to perform exposure with high precision without being influenced by the variation in the transmittance of the optical system.

In this case, as well, it is preferable that the exposure At amount control system controls the exposure amount based on the exposure amount control target value and the output from the first optical sensor when transferring the pattern onto the substrate.

In this case, the timing to detect the amount of exposure light having passed through the optical system to update the exposure amount control target value may be determined in accordance with the exposure condition which influence the transmittance of the optical system. For example, the control unit may detect the amount of exposure light having passed through the optical system at a timing which corresponds to a transmittance of the mask on which the pattern is formed. Alternatively, the control unit may detect the amount of exposure light having passed through the optical system at a timing set in consideration of one of a minimum line width and a permissible exposure amount error.

In the first exposure apparatus according to the present invention, when the apparatus further comprises: a first optical sensor disposed in the light path of the exposure light to detect the amount of exposure light illuminated on the pattern, it is preferable that the exposure amount control system controls the exposure amount based on the exposure amount control target value and an output from the first optical sensor when transferring the pattern onto the substrate. In such a case, by obtaining the actual exposure amount based on the light amount detected by the first optical sensor, and by feedback-control to reduce the difference (deviation) between the exposure amount and the exposure amount control target value to zero, exposure amount control with high accuracy can be performed.

In the first exposure apparatus according to the present invention, when the apparatus further comprises: a calculation unit to determine a transmittance time-varying prediction function of the optical system in accordance with an irradiation history of exposure light on the optical system, the exposure amount setting unit may set the exposure amount control target value based on the transmittance time-varying prediction function determined by the calculation unit.

According to this apparatus, the calculation unit determines a transmittance time-varying prediction function of the optical system in accordance with an irradiation history of exposure light on the optical system. And based on the determined transmittance time-varying prediction function, the exposure amount setting unit sets the exposure amount control target value. When the pattern is transferred, the exposure amount is controlled based on the set exposure amount control target value by the exposure amount control system. Therefore, accurate exposure amount control (predictive control) can be performed in accordance with the predicted transmittance based on the transmittance time-varying prediction function, without frequently performing transmittance measurement during exposure. Patterns can be transferred onto the substrate by using the optical system while the image plane illuminance (substrate surface illuminance) is always set at an almost desired value. Therefore, exposure with high precision can be performed, without being influenced by changes in the transmittance of the optical system.

In this case, the apparatus can further comprise: a transmittance measurement unit to measure the transmittance of the optical system at a predetermined interval; and a correction unit connected with the calculation unit to correct the transmittance time-varying prediction function each time the transmittance measurement is performed. In such a case, when the transmittance measurement unit measures the transmittance of the optical system, the correction unit can correct the transmittance time-varying prediction function each time such measurement is performed. As a consequence, errors in exposure amount predictive values are corrected at the predetermined interval, thus allowing a more accurate exposure amount control.

In this case, the apparatus can further comprise: a control unit connected with the transmittance measurement unit to set the transmittance measurement interval of the transmittance measurement unit in accordance with a variation amount between a transmittance obtained by a most recent transmittance measurement and a transmittance obtained by a measurement performed before the most recent measurement, the measurement performed by the transmittance measurement unit. In such a case, when the rate of change in transmittance is high and a transmittance needs to be frequently measured, short transmittance measurement intervals are set. And when the rate of change in transmittance is low, long transmittance measurement intervals are set. Thereby allowing exposure with high precision without decreasing unnecessarily the throughput.

In the first exposure apparatus according to the present invention, it can further comprise: a mask stage disposed between the illumination optical system and the projection optical system to hold the mask on which the pattern is formed; and a substrate stage disposed in an image plane side of the projection optical system to hold the substrate, wherein the optical system includes an illumination optical system disposed in an optical path of the exposure light to illuminate the mask on which the pattern is formed with the exposure light, and a projection optical system disposed in the optical path of the exposure light to project the exposure light which exits from the mask onto the substrate. With this apparatus, the mask held on the mask stage is illuminated with exposure light from the illumination optical system, and the pattern on the mask is transferred onto the substrate on the substrate stage through the projection optical system. In this case, as described above, the exposure amount control target value is set in accordance with the transmittance of the optical system, and when transferring the pattern, the exposure amount is controlled based on the set exposure amount control target value. This makes it possible to provide a static type exposure apparatus such as a stepper, which can perform exposure with high precision while always setting the illuminance of the substrate surface (image plane illuminance) at a desired (appropriate) value.

In this case, the apparatus can further comprise; a driving unit connected with the mask stage and the substrate to synchronously move the mask stage and the substrate stage in a linear direction perpendicular to an optical axis of the projection optical system. In such a case, a scanning projection exposure apparatus which can perform exposure with high precision while always setting the illuminance of the substrate surface (image plane illuminance) at a desired (appropriate) value without being influenced by transmittance variations can be provided.

According to the seventh aspect of the present invention, there is provided a second exposure apparatus to transfer a pattern illuminated with exposure light from a light source onto a substrate through an optical system, the exposure apparatus comprising: a measurement unit to measure a variation in an amount of exposure light passing through the optical system; and a control unit connected with the measurement unit to change intervals of the measurement performed by the measurement unit in accordance with an exposure condition.

In this case, the structure of the measurement unit can include a first optical sensor disposed in an optical path of the exposure light to detect the amount of exposure light irradiated on the pattern, and a second optical sensor arranged to be substantially flush with the substrate.

According to the eighth aspect of the present invention, there is provided a third exposure apparatus to transfer a pattern illuminated with exposure light from a light source onto a substrate through an optical system, the exposure apparatus comprising: a measurement unit to measure a variation in an amount of exposure light passing through the optical system; and a control unit connected with the measurement unit to change an interval of a measurement performed by the measurement unit, in accordance with a comparison result of a variation of a first measurement of the light amount and a variation of a second measurement of the light amount.

According to the ninth aspect of the present invention, there is provided a fourth exposure apparatus to transfer a pattern illuminated with exposure light from a light source onto a substrate through an optical system, the exposure apparatus comprising: a unit which communicates with the optical system to self-clean the optical system by irradiating the optical system with the exposure light in a predetermined condition before starting of exposure; a calculation unit connected with the unit to determine a transmittance time-varying prediction function of the optical system in consideration of the predetermined condition; and an exposure amount setting unit connected with the calculation unit to set an exposure amount control target value based on the determined transmittance time-varying prediction function.

According to the tenth aspect of the present invention, there is provided a fifth exposure apparatus to transfer a pattern illuminated with exposure light from a light source onto a substrate through an optical system, the exposure apparatus comprising: a measurement unit to measure an amount of exposure light passing through the optical system at a predetermined interval; and a control unit connected with the measurement unit to set the interval of a measurement performed by the measurement unit in accordance with an exposure condition.

According to the eleventh aspect of the present invention, there is provided a method of making an exposure apparatus to transfer a pattern of a mask onto a substrate, the method comprising: providing an illumination optical system to irradiate the mask with exposure light; providing a projection optical system to project the exposure light emitted from the mask onto the substrate; providing a substrate stage to hold the substrate; providing an exposure amount setting unit to set an exposure amount control target value in accordance with a transmittance of the projection optical system; and providing an exposure amount control system to control an exposure amount based on the exposure amount control target value.

According to this method, the exposure apparatus of the present invention can be produced by mechanically, optically, and electrically combining and adjusting the illumination optical system, projection optical system, substrate stage, exposure amount setting unit, exposure amount control system, and various other components. In this case, a static type exposure apparatus based on the step-and-repeat method can be produced.

The method of producing an exposure apparatus according to the present invention can further comprise: providing a mask stage to hold the mask; and providing a driving unit to synchronously move the mask stage and the substrate stage on respective planes parallel to a linear direction perpendicular to an optical axis of the projection optical system. In this case, for example, a scanning exposure apparatus based on the step-and-scan method can be produced, which can control the exposure amount by changing and adjusting the relative scanning velocity of the mask stage and substrate stage.

In a lithographic process, when exposure is performed using the exposure method in the present invention, a plurality of layers of patterns can be formed on a substrate with high overlay accuracy. This makes it possible to manufacture micro devices with a higher integration degree and a high yield, thus improving the productivity. Likewise, by performing exposure using the exposure apparatus of the present invention in the lithographic process, the exposure amount control precision is improved, and hence the line width control precision is improved. Therefore, a plurality of layers of pattern can be formed on a substrate with high overlay accuracy. Consequently, this allows manufacturing of microdevices with a higher integration degree and a high yield, thus improving the productivity. Thus, according to another aspect, the present invention is a device manufacturing method using the exposure method of the present invention or the exposure apparatus of the present invention, and a device manufactured by the manufacturing method.

DESCRIPTION OF THE PREFERRED EMBODIMENTS

First Embodiment

The first embodiment of the present invention will be described below with reference to FIGS. 1 to 3.

Figure 1:
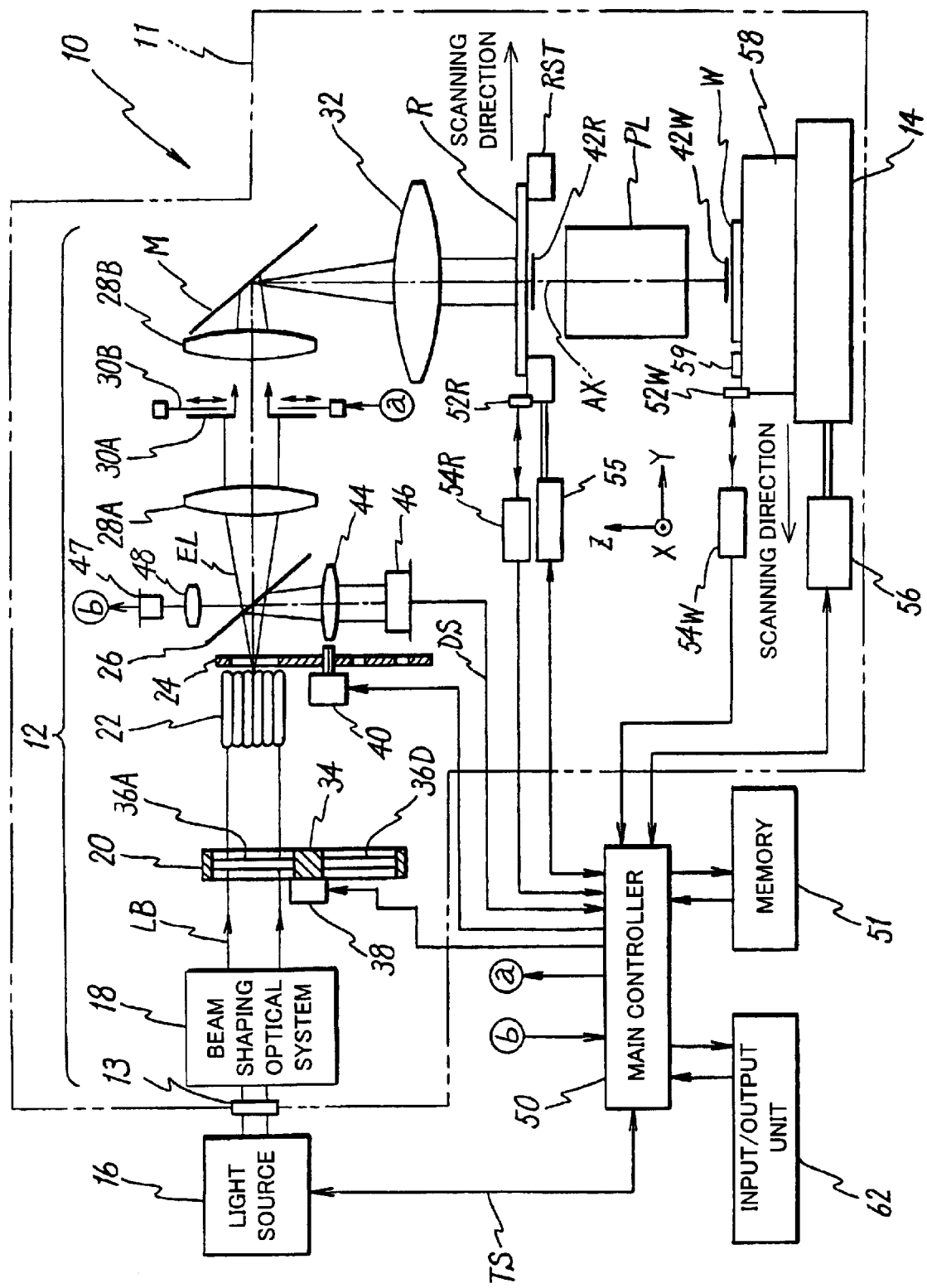
FIG. 1 is a view schematically showing the arrangement of an exposure apparatus according to the first embodiment of the present invention.

FIG. 1 shows the schematic arrangement of an exposure apparatus 10 according to the first embodiment. This exposure apparatus 10 is a scanning exposure apparatus based on a step-and-scan method which uses an ArF excimer laser light source (oscillation wavelength: 193 nm) as an exposure light source.

The exposure apparatus 10 includes: an illumination system structured of a light source 16 and an illumination optical system 12; a reticle stage RST to hold a reticle R as a mask illuminated with exposure light EL from the illumination system; a projection optical system PL to project the exposure light EL emerging from the reticle R onto a wafer W as a substrate; an X-Y stage 14 on which a Z tilt stage 58 as a substrate stage for holding the wafer W is mounted; a control system for these components, and the like.

The light source 16 is, in actual, arranged in a service room with low degree of cleanliness, separate from a clean room. In the clean room, a chamber 11 is set up which houses the structuring elements of the illumination optical system 12, reticle stage RST, projection optical system PL, X-Y stage 14 which configure the exposure apparatus. The light source 16 is connected to the chamber 11 via a beam matching unit (not shown in Figs.). As this light source, a KrF excimer laser light source (oscillation wavelength: 248 nm), $F_2$ laser light source (oscillation wavelength: 157 nm), or other pulse light sources may be used.

Figure 2:
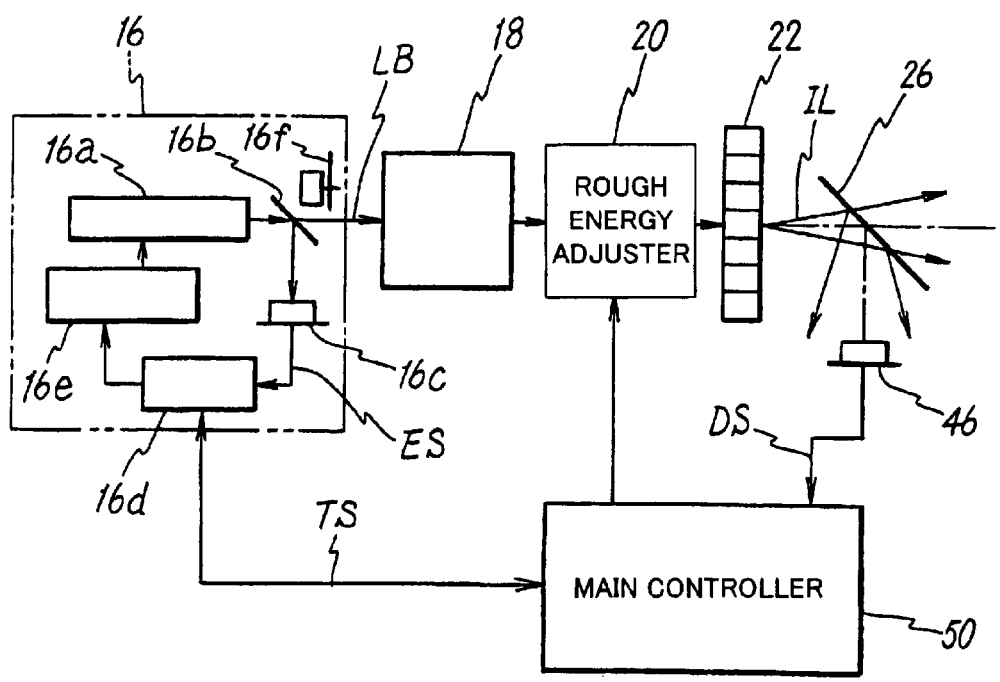
FIG. 2 is a view showing the internal arrangement of a light source in FIG. 1.

FIG. 2 shows the internal arrangement of the light source 16, together with a main controller 50. The light source 16 has a laser resonator 16a, beam splitter 16b, energy monitor 16c, energy controller 16d, high-voltage power supply 16e, and the like.

A laser beam LB emitted in the form of pulse light from the laser resonator 16a is incident on the beat splitter 16b, which has a high transmittance and a low reflectivity. The laser beam LB passing through the beam splitter 16b is emitted externally, and the laser beam LB reflected by the beam splitter 16b, is incident on the energy monitor 16c structured of a photoelectric conversion device. And a photoelectric conversion signal from the energy monitor 16c is supplied to the energy controller 16d as an output ES via a peak hold circuit (not shown in Figs.).

In a normal emission state, the energy controller 16d feedback-controls the power supply voltage of the high-voltage power supply 16e so that the output ES from the energy monitor 16c corresponds to a target value of energy per pulse within the control information TS supplied from the main controller 50. In addition, the energy controller 16d controls the energy supplied to the laser resonator 16a through the high-voltage power supply 16e, thereby also changing the oscillation frequency. That is, the energy controller 16d determines the oscillation frequency of the light source 16 to a frequency instructed by the main controller 50 in accordance with the control information TS from the main controller 50. The energy controller 16d also feedback-controls the power supply voltage of the high-voltage power supply 16e so that the energy per pulse in the excimer laser light source 16 becomes a value instructed by the main controller 50. The details of this technique are disclosed in, for example, Japan Patent Laid Open No. 8-250402 and U.S. Pat. No. 5728495. The disclosures in the reference cited above are fully incorporated by reference herein.

Also, outside the beam splitter 16b in the excimer laser light source 16, a shutter 16f is arranged which shields the laser beam LB in accordance with control information from the main controller 50.

Referring back to FIG. 1, the illumination optical system 12 includes: a beam shaping optical system 18; a rough energy adjuster 20; fly-eye lens 22; illumination system aperture stop plate 24; beam splitter 26; a first relay lens 28A; a second relay lens 28B; a fixed reticle blind 30A; a movable reticle blind 30B; an optical path deflecting mirror M; condenser lens 32; and the like. A rod lens may be used as an optical integrator instead of the fly-eye lens 22.

The beam shaping optical system 18 is connected to the beam matching unit (not shown Figs.) via a light transmission window 13 arranged in the chamber 11. The beam shaping optical system 18 shapes the cross-sectional shape of the laser beam LB which is a pulse beam emitted from the light source 16, passing through the light transmission window 13. Thus, the laser beam LB can be efficiently incident on the fly-eye lens 22 arranged downstream of the optical path of the laser beam LB. The beam shaping optical system 18 can be configured, for example, of a cylinder lens or beam expander (neither is shown in Figs.).

The rough energy adjuster 20 is arranged on the optical path, further downstream of the beam shaping optical system 18 of the laser beam LB. In this case, a plurality of (e.g., six) ND filters (FIG. 1 shows two ND filters 36A and 36D of the ND filters) having different transmittances (=1-attenuation ratio) are arranged around a rotating plate 34.

The transmittance to the incident laser beam LB can be switched geometrically in steps from 100% by rotating the rotating plate 34 using a driving motor 38. The driving motor 38 is controlled by the main controller 50, which is described later in the description. The transmittance may be adjusted more finely by preparing another rotating plate identical to the rotating plate 34, combining them to make two sets of ND filters.

The fly-eye lens 22 is located on the optical path of the laser beam LB outgoing from the rough energy adjuster 20, and forms many secondary sources so as to illuminate the reticle R with light which has a uniform illuminance distribution. The laser beam emerging from each secondary light source will be referred to as "exposure light EL" hereinafter.

The illumination system aperture stop plate 24 formed of a disk-shaped member is arranged in the vicinity of the emitting surface of the fly-eye lens 22. The illumination system aperture stop plate 24 may have a plurality of aperture stops arranged at equal angular intervals: an aperture stop of an ordinary circular aperture; a small circular aperture and designed to reduce the C value which is a coherence factor; a ring-shaped aperture stop for ring-shaped illumination; and a plurality of aperture stops of which each central position differ from the optical axis position for modified illumination (only two types of apertures are shown in FIG. 1). The main controller 50 (to be described later) rotates and controls the illumination system aperture stop plate 24 via a driving unit 40 such as a motor. With this operation, one of the aperture stops is selectively chosen and arranged on the optical path of the exposure light EL.

The beam splitter 26 which has a low reflectivity and a high transmittance is arranged on the optical path of the exposure light EL emerging from the illumination system aperture stop plate 24. In addition, a relay optical system is arranged on the optical path further downstream of the beam splitter 26. The relay optical system is structured of the first and second relay lenses 28A and 28B with the fixed reticle blind 30A and the movable reticle blind 30B being arranged in between.

The fixed reticle blind 30A is arranged on a plane that is slightly defocused from a plane conjugate to the pattern surface of the reticle R, and has a rectangular opening for determining an illumination area 42R on the reticle R. Close to the fixed reticle blind 30A, the movable reticle blind 30B is arranged, which has an opening portion that is variable in position and width in the scanning direction. At the beginning and end of scanning exposure, the movable reticle blind 30B further restricts the illumination area 42R to prevent exposure on an unnecessary portion.

The deflecting mirror M for reflecting the exposure light EL transmitted through the second relay lens 28B toward the reticle R is arranged on the optical path of the exposure light EL downstream of the second relay lens 28B of the relay optical system. The condenser lens 32 is arranged on the optical path of the exposure light EL, further down of the deflecting mirror M.

In addition, in the illumination system 12, an integrator sensor 46 as the first optical sensor structured of a photoelectric conversion device, and a reflected light monitor 47 are respectively arranged on the optical paths vertically deflected on either sides by the beam splitter 26. As the integrator sensor 46 and reflected light monitor 47, for example, PIN photodiodes and the like that have sensitivity in the far-ultraviolet region and high response frequencies to detect pulse emissions from the excimer laser light source 16c an be used.

The function of the illumination system 12 having this arrangement will be briefly described below. The laser beam LB emitted from the light source 16 by pulse emission is incident on the beam shaping optical system 18, in which the cross-sectional shape of the laser beam LB is shaped so that the laser beam can be efficiently incident on the fly-eye lens 22. The laser beam LB is then incident on the rough energy adjuster 20, transmitted through one of the DN filters of the rough energy adjuster 20, and incident on the fly-eye lens 22. With this operation, multiple secondary light sources are formed at the exit end of the fly-eye lens 22. The exposure light EL emerging from these multiple secondary light sources passes through one of the aperture stops on the illumination system aperture stop plate 24 and reaches the beam splitter 26 having a high transmittance and a low reflectivity. The exposure light EL transmitted through the beam splitter 26 passes through the first relay lens 28A and then proceeds to the rectangular opening portion of the fixed reticle blind 30A and the movable reticle blind 30B. It then goes onto the second relay lens 28B, and its optical path is vertically bent downward by the deflecting mirror M. After it is deflected, the exposure light EL passes through the condenser lens 32 and illuminates the rectangular illumination area 42R on the reticle R with a uniform illuminance distribution, the reticle R held on the reticle stage RST.

The exposure light EL that is reflected by the beam splitter 26 proceeds to the integrator sensor 46 via a condenser lens 44. A photoelectric conversion signal from the integrator sensor 46 is supplied as an output DS (digit/pulse) to the main controller 50 through a peak hold circuit and A/D converter (neither is shown in Figs.). The correlation coefficient between the output DS from the integrator sensor 46 and the illuminance (exposure amount) of the exposure light EL on the surface of the wafer W is obtained in advance, and stored in a memory 51 connected to the main controller 50.

The light beam that illuminates the illumination area 42R on the reticle R and is reflected by the pattern surface (the lower surface in FIG. 1) of the reticle, travels in a reversed direction and passes through the condenser lens 32 and relay optical system. It is then reflected by the beam splitter 26, and received by the reflected light monitor 47 via a condenser lens 48. A photoelectric conversion signal from the reflected light monitor 47 is supplied to the main controller 50 through the peak hold circuit and A/D converter (neither is shown in Figs.). The reflected light monitor 47 is mainly used to measure the transmittance of the reticle R in advance in this embodiment. This operation will be described later.

The reticle R is mounted on the reticle stage RST and is held on the stage by, for example, vacuum chucking. The reticle stage RST can be finely driven within a horizontal plane (X-Y plane). It can also be driven in the scanning direction (the Y direction which is the lateral direction on the drawing surface of FIG. 1 in this case) in a predetermined stroke range by the reticle stage driving portion 55. The position of the reticle stage RST during this scanning operation is measured by an external laser interferometer 54R via a movable mirror 52R fixed on the reticle stage RST. The measurement value obtained by this laser interferometer 54R is supplied to the main controller 50.

Materials for the reticle R must be selectively used depending on the light source to be used. More specifically, if a KrF excimer laser light source or an ArF excimer laser light source is used as the light source, synthetic quartz can be used. If, however, an $F_2$ laser light source is used, the reticle R must be made of fluorite.

The projection optical system PL is structured of a plurality of lens elements that have a common optical axis AX in the Z-axis direction, and are arranged to form an optical arrangement which is double telecentric. In addition, as this projection optical system PL, an optical system having a projection magnification β of, for example, ¼ or ⅕ is used. For this reason, when the illumination area 42R on the reticle R is illuminated with the exposure light EL in the manner described above, an image of a pattern formed on the reticle R which is reduced by the projection optical system PL at the projection magnification β is projected and exposed onto a slit-shaped exposure area 42W on the wafer W coated with a resist (photosensitive agent).

In the case of using a KrF excimer laser beam or ArF excimer laser beam as the exposure light EL, synthetic quartz or the like can be used for the respective lens elements constituting the projection optical system PL. When, however, an $F_2$ laser beam is used, fluorite is used alone as a material for the lenses used for this projection optical system PL.

The X-Y stage 14 is two-dimensionally driven by a wafer stage driving portion 56, in the Y direction being the scanning direction, and ih the X direction (perpendicular to the drawing surface of FIG. 1) perpendicular to the Y direction. The wafer W is held on the Z tilt stage 58, which is mounted on the X-Y stage 14, via a wafer holder (not shown in Figs.) by vacuum chucking or the like. The Z tilt stage 58 has the function of adjusting the Z-direction position (focal position) of the wafer W, and also adjusting the tilt angle of the wafer W with respect to the X-Y plane.

That is, although not shown in Figs., the Z-direction position of the wafer W is measured by a focus sensor formed from the multiple focal position detection system disclosed in, for example, Japan Patent Laid Open No. 6-283403 and U.S. Pat. No. 5,448,332 corresponding thereto. An output from this focus sensor is supplied to the main controller 50, and the main controller then controls the Z tilt stage 58, thus performing so-called focus leveling control. The disclosures cited above are fully incorporated by reference herein.

The position of the X-Y stage 14 is measured by an external laser interferometer 54W via a movable mirror 52W fixed on the Z tilt stage 58. The measurement value from the laser interferometer 54W is supplied to the main controller 50.

On the Z tilt stage 58, an irradiation amount monitor 59 is arranged so that the light-receiving surface of the irradiation amount monitor 59 is almost flush with the surface of the wafer W. The irradiation amount monitor serves as the second optical sensor for detecting the amount of exposure light EL having passed through the projection optical system PL. A different sensor such as an illuminometer, irradiation unevenness sensor formed from a pinhole sensor, photochromic, or spatial image detector may be used alternatively as the second optical sensor instead of the irradiation amount monitor.

The control system, as shown in FIG. 1, is structured mainly of the main controller 50 serving as a control unit. The main controller 50 includes a so-called microcomputer (or workstation) configured of a CPU (Central Processing Unit), ROM (Read Only Memory), RAM (Random Access Memory), and the like. The main controller systematically controls exposure so that operations such as synchronous scanning of the reticle R and wafer W, stepping of the wafer W, exposure timing, are performed accurately. In this embodiment, the main controller 50 also controls the exposure amount in scanning exposure, as will be described later.

More specifically, the main controller 50 respectively controls the position and speed of the reticle stage RST and X-Y stage 14 via the reticle stage driving portion 55 and wafer stage driving portion 56 based on the measurement values obtained by the laser interferometers 54R and 54W on scanning exposure. By this control, the wafer W is scanned synchronously via the X-Y stage 14, with respect to the exposure area 42W in the −Y direction (or +Y direction) at a speed Vw=β·v (β is the projection magnification of the reticle R wafer W), with the reticle R scanned in the +Y direction (or −Y direction) at a speed Vr=V via the reticle stage RST. In this embodiment, therefore, the reticle stage driving portion 55, the wafer stage driving portion 56, and the main controller 50 structure a driving unit for synchronously driving the reticle stage RST and X-Y stage 14 in a linear direction. In stepping operation, the main controller 50 controls the position of the X-Y stage 14 via the wafer stage driving portion 56 based on the measurement A; values obtained by the laser interferometer 54W.

On scanning exposure, in order to provide the wafer W with the target exposure amount determined by an exposure condition and resist sensitivity, the main controller 50 adjusts the amount of light irradiated on the reticle R. The light adjustment is performed by the main controller supplying the control information TS to the light source 16, while monitoring an output from the integrator sensor 46 so as to control, for example, the oscillation frequency (emission timing), emission energy of the light source 16, or the rough energy adjuster 20 through the motor 38. In addition, the main controller 50 controls the illumination system aperture stop plate 24 via the driving unit 40, and also controls the opening/closing operation of the movable reticle blind 30B synchronously with the operation information of the stage system.

As described above, in this embodiment, the main controller 50 also serves as an exposure controller (exposure amount control system) and stage controller (stage control system). Obviously, however, these controllers may be prepared independently of the main controller 50.

An exposure sequence to transfer a reticle pattern onto a predetermined number of (M=100 in this case) wafers W with the exposure apparatus 10 of this embodiment which has the structure described above, will be described next. The description will be made with reference to the flow chart of FIG. 3, which shows a control algorithm for the CPU in the main controller 50.

Premises will be described first.

① Shot map data (data defining the exposure order and the scanning directions of the respective shot area) is to be generated in advance, based on the shot array, shot size, the exposure order of the respective shots, and other necessary data, which are to be input by an operator through an input/output unit 62 (see FIG. 1) such as a console, and is to be stored in the memory 51 (see FIG. 1).

② The output DS of the integrator sensor 46 is to be calibrated with respect to an output from a reference illuminometer (not shown in Figs.) arranged flush of the image plane (i.e., a wafer surface) on the Z tilt stage 58. The data processing unit in this reference illuminometer is (mj/(cm$^2$·pulse)) which is a physical quantity. Calibrating the integrator sensor 46 is equivalent to obtaining a conversion coefficient K1 (or conversion function) to convert the output DS (digit/pulse) of the integrator sensor 46 into the exposure amount (mj/(cm$^2$·pulse)) on the image plane. With the use of this conversion coefficient K1, the exposure amount on the image plane can be indirectly measured from the output DS of the integrator sensor 46.

③ The output ES from the energy monitor 16c is also tone calibrated with respect to the output DS of the integrator sensor 46 already having completed the calibration described earlier, and a correlation coefficient K2 between the two values it to be obtained and stored in the memory 51.

④ The output from the reflected light monitor 47 is to be calibrated with respect to the output of the integrator sensor 46 already having completed the calibration described earlier, and a correlation coefficient K3 between the output from the integrator sensor 46 and the output from the reflected light monitor 47 is to be obtained and stored in the memory 51.

⑤ A table data which indicates the optical system transmittance measurement timing in correspondence with different exposure conditions as shown below (Table 1) is to be stored in the memory 51 of FIG. 1. A count value m of a first counter indicating the number of wafers exposed is to be initialized to "1", and a count value n of a second counter indicating the number of wafers processed at transmittance measurement interval is to be initialized to "0".

TABLE 1

| | Permissible Exposure Amount Error [%] | Minimum Line Width [nm] | | |
|---|---|---|---|---|
| | | 150 to 200 0.5 | 200 to 400 1.0 | 400 or more 2.0 |
| Reticle Transmittance [%] Rt | 0 < Rt ≦ 10 | 12 wafers | 1 lot | 2 lots |
| | 10 < Rt ≦ 20 | 6 wafers | 12 wafers | 1 lot |
| | 20 < Rt ≦ 30 | 4 wafers | 8 wafers | 16 wafers |
| | 30 < Rt ≦ 40 | 3 wafers | 6 wafers | 12 wafers |
| | 40 < Rt ≦ 50 | 2 wafers | 4 wafers | 9 wafers |
| | 50 < Rt ≦ 60 | 2 wafer | 4 wafers | 8 wafers |
| | 60 < Rt ≦ 70 | 1 wafer | 3 wafers | 6 wafers |
| | 70 < Rt ≦ 80 | 1 wafer | 3 wafers | 6 wafers |
| | 80 < Rt ≦ 90 | 1 wafer | 2 wafers | 5 wafers |
| | 90 < Rt ≦ 100 | 1 wafer | 2 wafers | 4 wafers |

Figure 3:
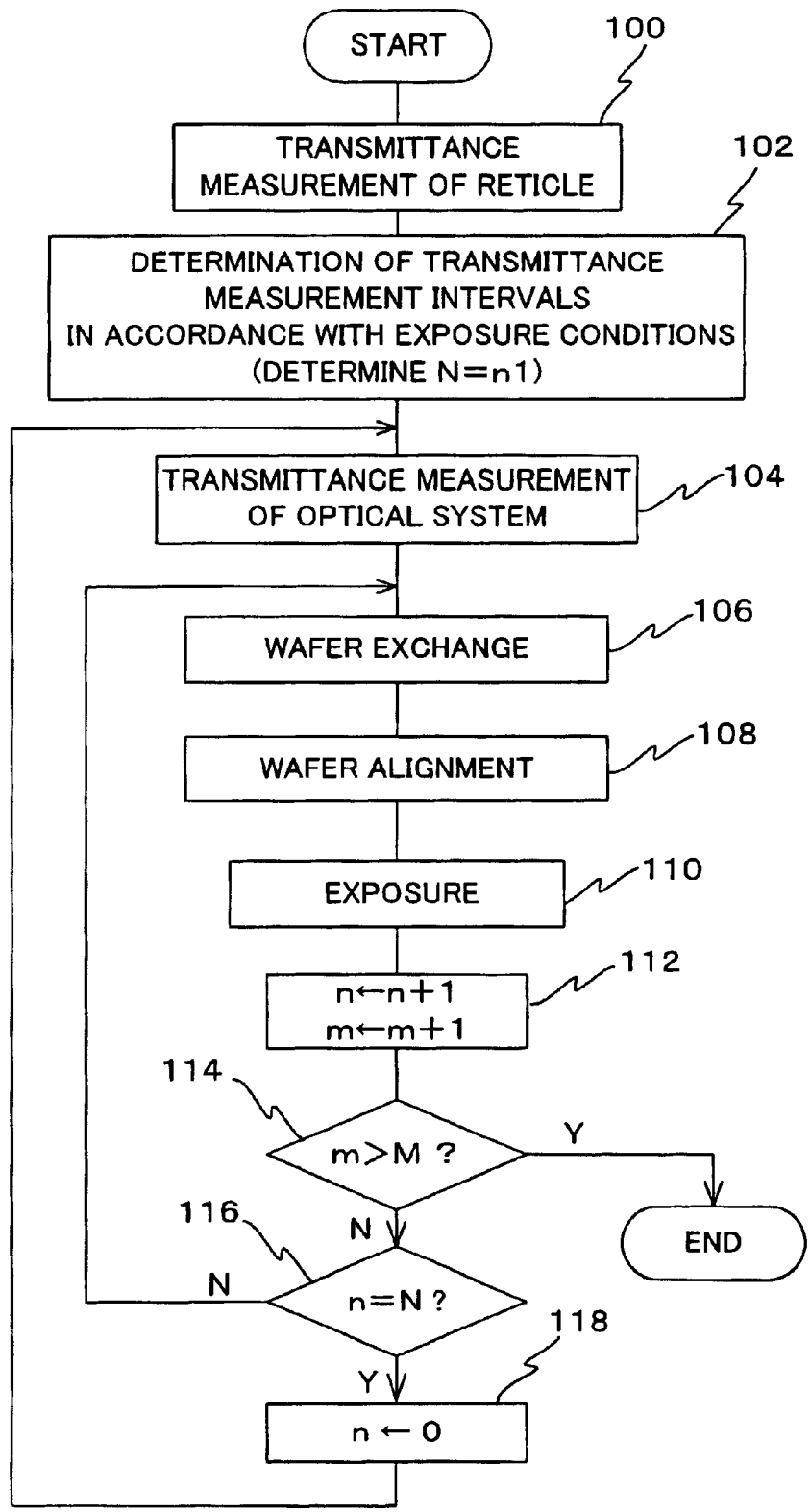
FIG. 3 is a flow chart showing a control algorithm for a CPU in a main controller in FIG. 1, which is used to transfer reticle patterns onto a predetermined number of wafers.

The control algorithm in FIG. 3 is to start when a series of preparatory operations are completed. First of all, the operator operates the input/output unit 62 (see FIG. 1) such as a console to input exposure conditions. The exposure conditions include illumination conditions (the numerical aperture N.A. of the projection optical system, a coherence factor σ, the type of reticle pattern (contact hole, line-and-space, or the like), the type of reticle (phase shift reticle, halftone reticle, or the like), the minimum line width or permissible exposure amount error, and the like). And in accordance with the input, the main controller 50 sets the aperture stop (not shown in Figs.) of the projection optical system PL, chooses and sets the aperture of the illumination system aperture stop plate 24. It also selects an attenuation filter of the rough energy adjuster 20, sets a target exposure amount corresponding to the resist sensitivity, and the like, and a series of preparatory operations, e.g., reticle loading, reticle alignment, and baseline measurement, is thus completed.

In step 100, the transmittance Rt (%) of the reticle R loaded on the reticle stage RST is obtained as follows. That is, pulse light is emitted from the light source 16, and the shutter 16f is opened to irradiate the reticle R with the exposure light EL. The transmittance Rt (%) is then calculated, by multiplying the correlation coefficient K3 to the ratio between the output from the integrator sensor 46 and reflected light monitor 47. The product is then subtracted from 1, and multiplied by 100, which is the transmittance Rt (%) of the reticle R. When this operation is performed, the X-Y stage 14 is located at a predetermined loading position apart from the position immediately below the projection optical system PL. Since the X-Y stage 14 is not positioned immediately below the projection optical system PL, reflected light from below the projection optical system PL is regarded as negligibly small in amount. In this case, to obtain the transmittance Rt (%) more accurately, the following operation can be performed.

That is, on the reticle R, a bar code containing information indicating the type of reticle, pattern density, reticle pattern and the reflectance of the reticle itself (glass material), is to be arranged. The main controller 50 reads the bar code on the reticle R via a bar code reader (not shown in Figs.) when the reticle R is loaded onto the reticle stage RST, and stores the information in the memory 51. Then, similar to the description above, the main controller 50 irradiates the reticle R with the exposure light EL, calculates the transmittance Rt (%) in accordance with the output of the integrator sensor 46 and reflected light monitor 47, and the reticle information stored in the memory 51.

Alternatively, there is a method of measuring the transmittances of all of the reticle R to be loaded on the reticle stage RST in advance, and storing the information in the memory 51 by reticle. The main controller 50 may select the transmittance information corresponding to the reticle R which is actually loaded on the reticle stage RST from the information stored in the memory 51, and obtain the transmittance of the reticle R. In either of the methods above, the shutter 16f is closed after the transmittance of the reticle is obtained.

In step 102, based on the exposure conditions input by the operator in advance and the reticle transmittance (%) obtained in step 100, the transmittance of an optical system, more specifically, the transmittance measurement interval of the optical system structured of the relay lenses 28A and 28B, condenser lens 32, and projection optical system PL, are determined by using the table (Table 1) stored in the memory 51. More specifically, the transmittance measurement is to be executed each time N slices of wafers are exposed, therefore, N is set to n1. For example, in the case the minimum line width is 250 nm (0.25 μm) or the permissible exposure amount error is 1.0%, and the reticle transmittance is 30%, N=n1 (=8) is set by using the Table 1, and stored in the memory 51. In addition, if, for example, the minimum line width is 250 nm (0.25 μm) or the permissible exposure amount error is 1.0%, and the reticle transmittance is 3%, N is set to 1 lot. That is, 1 lot corresponding to 25 wafers, N=n1 (=25), is set and stored in the memory 51. In the following description, N is set to N=n1=8.

In step 104, the transmittance of the optical system is measured as follows. The X-Y stage 14 is driven via the wafer stage driving portion 56 so as to position the irradiation amount monitor 59 immediately below the projection optical system PL, and the shutter 16f is opened. The ratio between the output of the integrator sensor 46 and the output of the irradiation amount monitor 59 is multiplied by 100, and also multiplied by a predetermined coefficient (K4). Thus measurement of the optical system is performed, and an exposure amount control target value is set in accordance with the measurement.

In step 106, instructions are given to a wafer transferring system (not shown in Figs.) to exchange the wafer W. With this operation, wafer exchange (only wafer loading, if there is no wafer on the stage) is performed on the X-Y stage by the wafer transferring system and a wafer loading/unloading mechanism (not shown in Figs.). In step 108, a series of alignment steps is performed, which include a so-called search alignment disclosed in, for example, Japan Patent Laid Open Nos. 09-186061 and 09-36202 and corresponding U.S. patent application Ser. No. 08/678788 and fine alignment (e.g., enhanced global alignment (EGA) disclosed in, for example, Japan Patent Laid Open No. 61-44429 and corresponding U.S. Pat. No. 4,780,617, which obtains the array coordinates of all shot areas on the wafer W by using a statistical method using the least-squares method). Wafer exchange and alignment, are performed similarly as in a known exposure apparatus. The above-cited disclosures are fully incorporated by reference herein.

In step 110, in accordance with the alignment results in step 108 and the shot map data, reticle patterns are transferred onto a plurality of shot areas on the wafer W. Accordingly, the operation of moving the wafer W to a scanning starting position for exposure on each shot area based on the step-and-scan method is repeated. During the scanning exposure, the main controller 50 performs the exposure amount control described above. In this case, the exposure amount control is performed based on the target value of the exposure amount control corresponding to the transmittance measured in step 104 and the output of the integrator sensor 46.

When exposure on the mth (first in this case) wafer W is completed, the flow advances to step 112 to increment the count value m of the first counter and the count value n of the second counter by one (n←n+1, m←m+1).

In step 114, the count value m is checked to see whether it has exceeded the predetermined wafer count M to be processed. When the first wafer W is completed, m=2, therefore, the result is negative. The flow then advances to step 116, to check whether the count value n is equal to N, i.e., n1=8. When the first wafer W is completed, since n=1, the result is also negative. The flow then returns to step 106, and the processing/judgement described above are repeated.

Then, when exposure on the eighth wafer is completed, n=8=N, the result is affirmative in step 116. The flow then advances to step 118 to reset the second counter (n←0), and returns to step 104 to measure the transmittance of the optical system as described above, stores the measurement result in the memory 51, that is, and updates the measurement value of transmittance.

Subsequently, the processing/judgement in step 106 and the subsequent steps are repeated. Each time eight wafers are exposed, the transmittance of the optical system is measured. When exposure on the 100th wafer W is completed, the result in step 114 becomes affirmative, completing the series of exposure process.

As is also obvious from the description above, in this embodiment, the integrator sensor 46, the irradiation amount monitor 59, and the main controller 50 configure a transmittance measurement unit. And the main controller 50 has the functions of the exposure amount setting unit and exposure amount control system.

As described above, according to this embodiment, in accordance with exposure conditions the main controller 50 determines the transmittance measurement interval of (step 102) the optical system (constituted by the first relay lenses 28A and 28B, condenser lens 32, and projection optical system PL). The main controller then executes transmittance measurement at the set measurement intervals (steps 104 to 116). That is, at a predetermined timing corresponding to the exposure conditions, the main controller 50 detects the amount of exposure light having passed through the optical system by using the irradiation amount monitor 59 on the Z tilt stage 58. The main controller then obtains the transmittance of the optical system based on the light amount and the output from the integrator sensor 46, thereby updates (sets) the target value of exposure amount control. And, until the next transmittance measurement is performed, exposure amount is controlled based on the target value of the exposure amount corresponding to the transmission previously measured and the output of the integrator sensor 46. Thus the pattern on the reticle R is transferred onto the wafers W via the projection optical system irradiated with the exposure light from the light source 16. As described above, with the exposure apparatus 10, the transmittance of the optical system is measured at the measurement interval set in accordance with the exposure conditions, and the exposure amount is controlled based on actual measurement of transmittance. Thus, regardless of the exposure conditions, and without any influences of variations in the transmittance of the optical system, the illuminance on each wafer surface (image plane illuminance) can always be set to a desired (appropriate) value, and a highly precise exposure can be achieved. Complicated calculation to estimate the transmittance is also not required.

In addition, this embodiment has exemplified the case wherein the main controller 50 automatically determines the transmittance measurement interval of the optical system in accordance with the reticle transmittance Rt and minimum line width (or permissible exposure amount error) (see Table 1). The following is the reason for this. If the reticle transmittance Rt is low, since the amount of change in the transmittance of the projection optical system PL or the like is small, the transmittance measurement interval of the optical system can be set relatively long. In contrast to this, if the reticle transmittance Rt is high, since the amount of change in the transmittance of the projection optical system PL or the like is large, the transmittance measurement interval of the optical system should be shortened. In addition, all consideration is given to the minimum line width because depending on the layer to be exposed, importance is attached to precision or processing speed. In summary, in this embodiment, the interval (timings) in which the transmittance of the optical system is measured are determined with reference to the reticle transmittance Rt and minimum line width in order to maximize the throughput while maintaining a sufficiently high exposure precision.

The present invention is not, however, limited to this. It is known that the transmittance of the optical system varies depending on various conditions (exposure condition in a broad sense). The conditions may be, for example, the N.A. of the illumination system, the N.A. of the projection optical system, the coherence factor σ, the type of reticle (phase shift reticle or the like), and reticle patterns (contact holes or periodic patterns). Obviously, the interval at which the transmittance of the optical system is measured may be automatically determined in accordance with any combination of the above reticle transmittance Rt and minimum line width (or permissible exposure amount error) and these exposure conditions. If, for example, optical system transmittance measurement interval is to be automatically set in accordance with the type of reticle, the patterns on the reticle, and the like, the following procedures can be taken. Information such as the type of reticle is recorded in the bar code on a portion of the reticle. While the reticle is being loaded, this information is read by a bar code reader. When the main controller 50 recognizes the type of reticle and the like, measurement intervals are automatically set. The method of recording information such as the type of reticle in the bar code on a portion of the reticle and reading the information with a bar code reader or the like while the reticle is loaded is disclosed in detail in, for example, Japan Patent Laid Open No.09-148229.

The above embodiment has exemplified the case wherein optical system transmittance measurement intervals are determined in accordance with predetermined exposure conditions, i.e., the transmittance of the optical system is repeatedly measured at intervals determined for the respective exposure conditions, e.g., in units of lots or predetermined number of wafers. If, however, exposure is to be continuously performed, since the transmittances of the projection optical system PL and the like do not change uniformly, it is preferable that optical system transmittance measurement intervals be automatically changed in accordance with the manner in which these transmittances change. In the second embodiment, consideration is given to this point.

Second Embodiment

The second embodiment of the present invention will be described next with reference to FIG. 4. The same reference numerals as in the first embodiment denote the same or equivalent parts in the second embodiment, and a description of thereabout will be omitted. The apparatus arrangement of the second embodiment is the same as that of the first embodiment except for the function of the main controller 50. This point will, therefore, be mainly described below.

Figure 4:
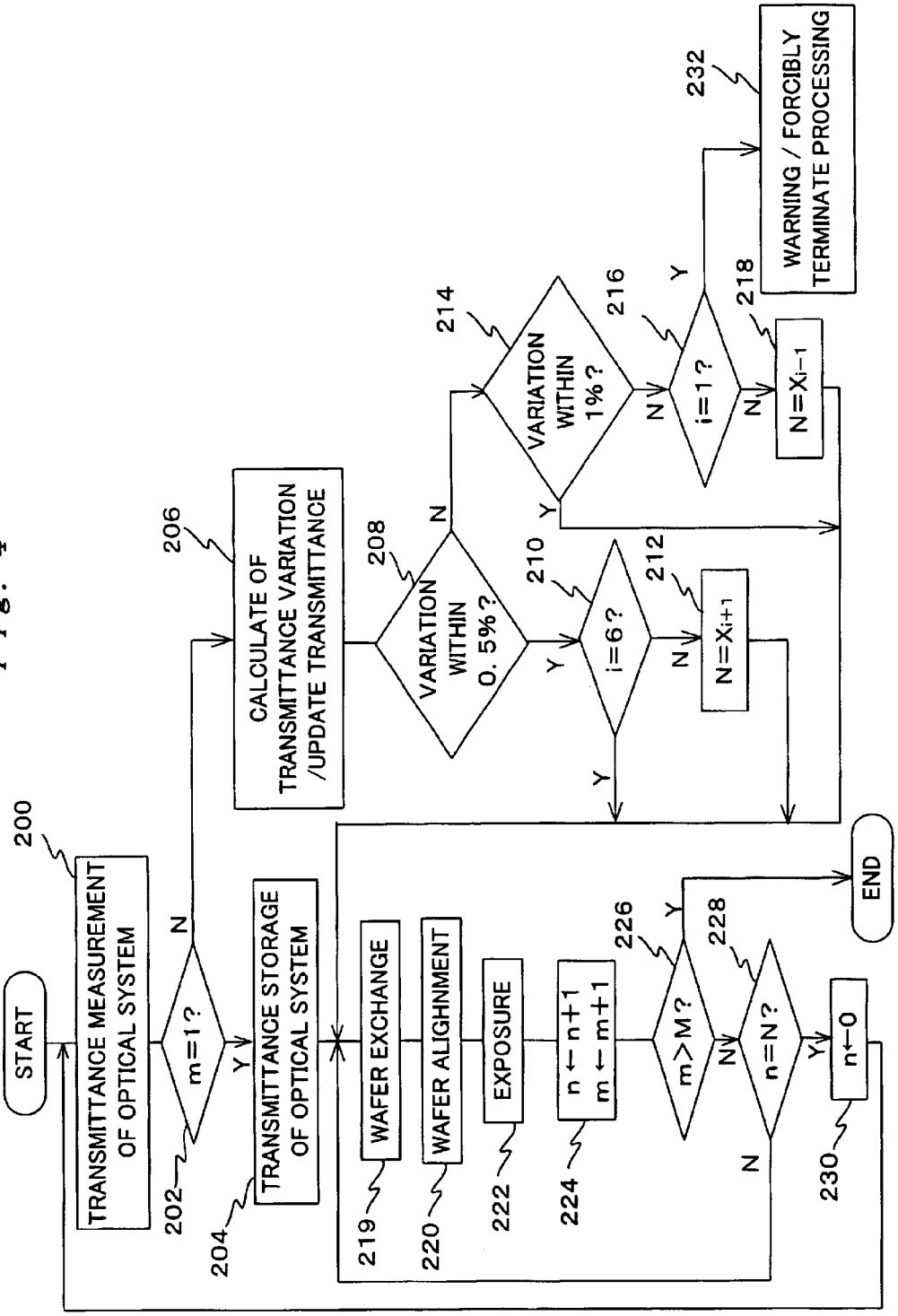
FIG. 4 is a flow chart showing a control algorithm for a CPU in a main controller, which is used to transfer reticle patterns onto a predetermined numbers of wafers in an exposure apparatus according to the second embodiment of the present invention.

FIG. 4 is a flow chart corresponding to the main control algorithm of the main controller 50 according to the second embodiment. An exposure sequence to be executed when reticle patterns are transferred onto a predetermined number of (M=1,000 in this case) wafers W by using the exposure apparatus according to the second embodiment, will be described with reference to FIG. 4.

As a premise, similar to the first embodiment, the shot map data is tone stored in the memory 51 (see FIG. 1) in advance. Also, calibration of the output of the integrator sensor 46 with respect to a reference illuminometer output, an energy monitor 16c in respect to the output of the integrator sensor 46 which has already completed calibration, and calibration of the reflected light monitor 47 output is to be completed. The count value m of the first counter indicating the number of wafers exposed is to be set to "1", and the count value n of the second counter indicating the number of wafers corresponding to transmittance measurement intervals is set to "0". In addition, the transmittance Rt of a reticle R used for exposure is measured in advance.

The control algorithm in FIG. 4 is to start when the operator operates the input/output unit 62 (see FIG. 1) such as a console to input exposure conditions. The conditions include illumination conditions, the type of reticle pattern, the type of reticle, the minimum line width, and the like. The main controller 50 then sets the aperture stop (not shown in Figs.) of a projection optical system PL, select and sets the aperture of an illumination system aperture stop plate 24. It also selects an attenuation filter of a rough energy adjuster 20, sets a target exposure amount corresponding to the resist sensitivity, and the like, and a series of preparatory operations, e.g., reticle loading, reticle alignment, and baseline measurement, is completed.

In the following description, for the sake of convenience, the transmittance measurement intervals of the optical system are changed in six steps, i.e., every wafer, every five wafers, every 10 wafers, every 25 wafers (one lot), every 50 wafers (two lots), and every 100 wafers (four lots). The respective wafer counts (measurement interval) are expressed as $X_i$ (i=1, 2, 3, 4, 5, 6).

In this case, the transmittance measurement intervals of the optical system are to be set to one lot, i.e., $N=X_4=25$ as a default value. And the permissible exposure amount error (assumed to coincide with the permissible transmittance change value of the optical system in this case) is to be set at 1%.

In step 200, as in step 104, the X-Y stage 14 is driven via the wafer stage driving portion 56 to position the irradiation amount monitor 59 immediately below the projection optical system PL, and the shutter 16f is opened. The ratio between the output from the integrator sensor 46 and the output from the irradiation amount monitor 59 at this stage, is then multiplied by 100 and a predetermined coefficient (K4), thereby measuring the transmittance of the optical system. The measurement results are stored in a temporary storage area of the RAM.

In step 202, the count value m of the first counter is checked to see whether it is "1" or not. Since before exposure on the first wafer W, m=1, therefore, the result is affirmative in step 202. The flow, thus, advances to step 204 to store the transmittance of the optical system, stored in the temporary storage area in step 200, into a predetermined area of the memory 51.

Subsequently, in steps 219, 220, 224, 226, and 228, the same processing/judgement as in steps 106 to 116 in FIG. 3 is performed, and the first to 25th wafers are sequentially exposed. When exposure on the last wafer W of a lot is completed, n=25=N, and the result is affirmative in step 228. The flow then advances to step 230 to reset the second counter (n←0), and returns to step 200 to re-measure the transmittance of the optical system and store the resultant data in the temporary storage area of the RAM in the same manner as described above. The flow then advances to step 202.

In step 202, it is checked whether the count value m of the first counter is "1". Since, in this case, m=26, the result is negative. The flow therefore advances to step 206.

In step 206, the difference (the amount of change in transmittance) between the current transmittance stored in the temporary storage area of the RAM and the previous transmittance stored in the predetermined area in the memory 51 is calculated. The calculation result is stored in another area in the RAM, and, the current transmittance is overwritten on the predetermined area in the memory 51, updating the transmittance.

In the next step 208, it is checked whether the amount of change in transmittance, which is calculated in step 206, is within 0.5%. If affirmative in step 208, the flow advances to step 210 to check whether the subscript "i" of $X_i$ that defines the transmittance measurement interval of the optical system is 6. In this case, $N=25=X_4$, i.e., i=4, and the result is negative in step 210. The flow therefore advances to step 212 to update the value N to $N=X_{i+1}$. In this case, the value N is updated to $N=X_5=50$, and the transmittance measurement interval of the optical system are changed from "1-lot interval" to "2-lot interval". Thereafter, the flow advances to step 219 to expose the wafers W of two lots.

If the result is affirmative in step 210, i.e., $N=X_6=100$ and the transmittance change amount is within 0.5%, since the longest transmittance measurement interval are intervals of 100 wafers in this embodiment, the flow advances to step 219 and repeats transmittance measurement each time exposure on the wafers W of four lots is completed.

Meanwhile, if the result in step 208 is negative, i.e., the transmittance change amount calculated in step 206 exceeds 0.5%, the flow then advances to step 214 to check whether the transmittance change amount is within 1%. If affirmative in step 214, since the transmittance change amount is within the permissible transmittance change error as a default value, the flow advances to step 219. In this case, if, for example, N=25=X4, exposure is performed on the wafers W of a lot. If the result is negative in step 214, i.e., the transmittance change amount calculated in step 206 exceeds 1%, the flow advances to step 216 to check whether the subscript "i" of $X_i$ that defines the transmittance measurement interval of the optical system is "1". If $N=25=X_4$, i.e., i=4, the result a is negative in step 216. The flow, therefore, advances to step 218 to update the value N to $N=X_{i-1}$. In this case, the value al N is updated to $N=X_3=10$, and the transmittance measurement interval of the optical system is updated from "1-lot interval" to "10-wafer interval". The flow then advances to step 219 to expose the 10 slices of wafers W.

If the result is affirmative in step 216, i.e., $N=X_1=1$ and the transmittance change amount exceeds 1%, the transmittance change has exceeded the permissible value even though the shortest transmittance measurement interval is set. In this case, if exposure is continued, the required preciseness cannot be met. Therefore, the step advances to step 232 to warn the operator with a buzzer (not shown in Figs.) or the like and forcibly terminates the exposure operation. This is because such a situation is likely to be caused by some abnormality.

When the wafers W are sequentially exposed in accordance with the above exposure processing routine, except when exposure is forcibly terminated, the 40 lots are sequentially exposed. And when exposure on the 1,000th wafer W is completed, M=1,001, and in step 226 the result becomes affirmative, terminating the series of exposure operations.

Obviously, as in the first embodiment, during scanning exposure in step 222, the main controller 50 is to perform exposure amount control in the manner above based on the exposure amount target value corresponding to the transmittance measured in step 200 and the output from the integrator sensor 46.

According to the second embodiment described above, the transmittance of the optical system is measured at a predetermined measurement interval, and the exposure amount is controlled based on transmittance, which is actually measured. Therefore, exposure can be performed without any complicated computation for transmittance estimation, while the illuminance of a wafer surface (image plane illuminance) is always kept at a desired (appropriate) value. In addition, according to the second embodiment, the subsequent transmittance measurement intervals are changed in accordance with the variation amount between the transmittance obtained in the most recent transmittance measurement and the transmittance obtained in the previous transmittance measurement. Therefore, in a interval when the rate of change in transmittance is high and hence transmittance must be frequently measured, short transmittance measurement intervals are to be set. Otherwise, long transmittance measurement intervals are to be set, thus high-precision exposure amount control can be achieved, without unnecessarily decreasing the throughput.

The second embodiment described above has exemplified the case wherein the transmittance measurement intervals are changed based on the amount of change in the transmittance of the optical system which is obtained after starting actual exposure. However, for example, the transmittance of the optical system may be measured twice or more prior to exposure, and measurement intervals may be automatically set based on the differences of the results.

The above embodiment has exemplified the case wherein the exposure apparatus automatically sets optical system transmittance measurement intervals in accordance with exposure conditions. However, the operator may automatically set the measurement intervals in accordance with exposure conditions. Likewise, the optical system transmittance measured during exposure may be shown on a display or the like, and the operator may set the transmittance measurement intervals according to the display.

The above embodiment has exemplified the exposure amount control method, in which on scanning exposure, exposure is performed in accordance with exposure conditions and resist sensitivity to meet a target exposure amount on the wafer W. To provide the wafer W the target exposure amount, the oscillation frequency (emission timing) and emission energy of the light source 16 are controlled, or the attenuation ratio of the rough energy adjuster 20 is adjusted. In a scanning exposure apparatus, however, on scanning exposure, the exposure amount can be adjusted by changing the scanning velocity while keeping the power of the light source 16 and the velocity ratio between the reticle stage RST and the X-Y stage 14 at a constant level. Alternatively, exposure amount can be controlled by controlling a movable reticle blind 30B in an illumination optical system 12 and changing the width (so-called slit width) of an illumination area 42R in the scanning direction. Furthermore, the exposure amount can be adjusted by combining the adjustment of scanning velocity and the adjustment of slit width.

In either case, the transmittance variations of the projection optical system PL and the like influence the illuminance of a wafer surface. Therefore, to cancel out the influence, and to always provide the wafer W with a target exposure amount, the exposure amount control target value (the control target value of a pulse oscillation frequency, pulse energy, attenuation ratio, scanning velocity, slit width, or the like) is to be updated. Likewise, when exposure conditions are changed for the same purpose, it is preferable that the transmittance be measured, and the above exposure amount control target value be updated in accordance with the measured transmittance. In addition, since the transmittance varies in different manners in accordance with the respective exposure conditions, it is preferable that the transmittance measurement intervals are set in accordance with the exposure conditions.

Third Embodiment

The third embodiment of the present invention will be described next with reference to FIGS. 5 to 7. The same reference numerals as in the first embodiment denote the same or equivalent parts in the third embodiment, and a description thereabout will be simplified or omitted.

Figure 5:
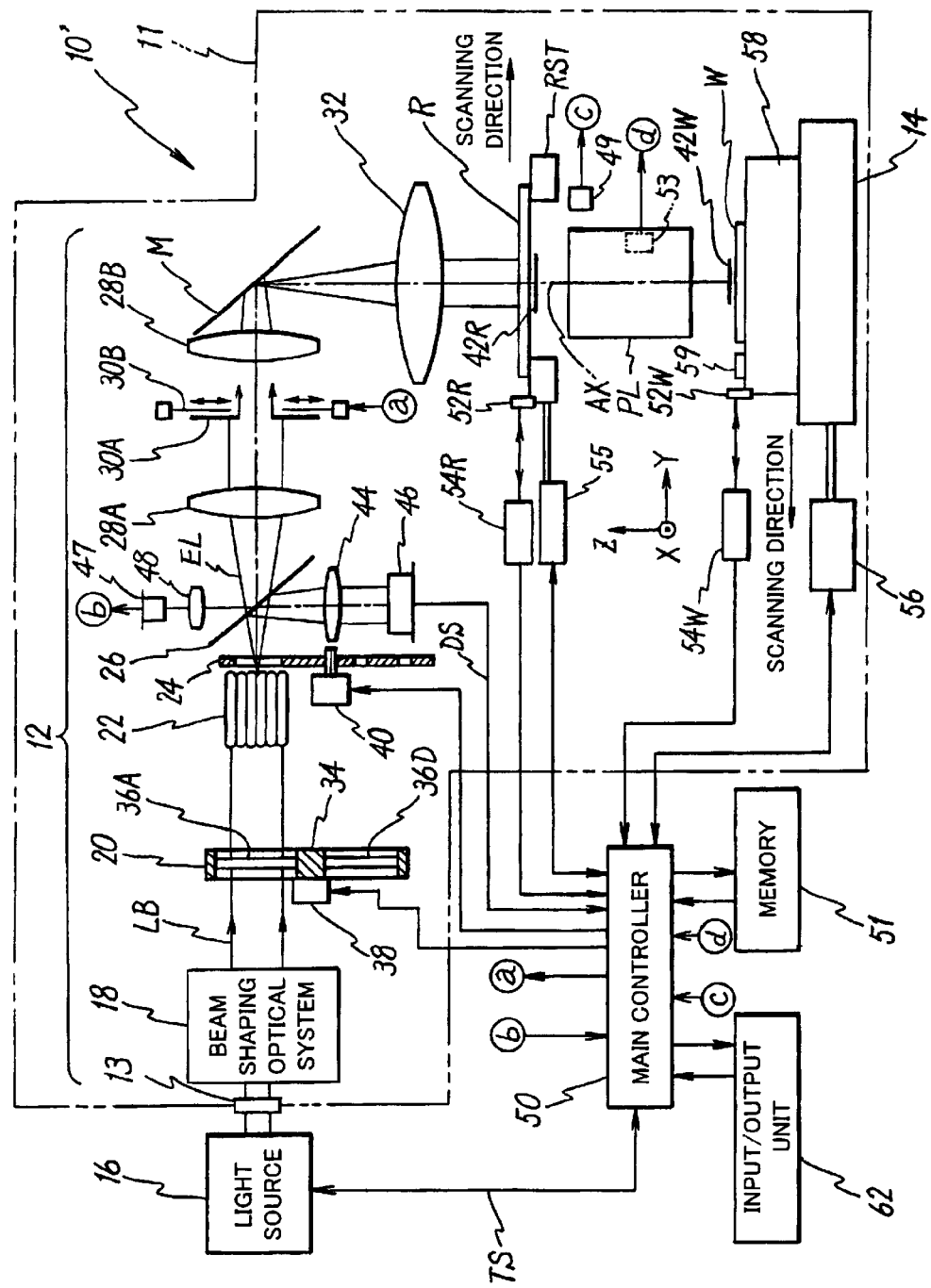
FIG. 5 is a view schematically showing the arrangement of an exposure apparatus according to the third embodiment of the present invention.
Figure 6:
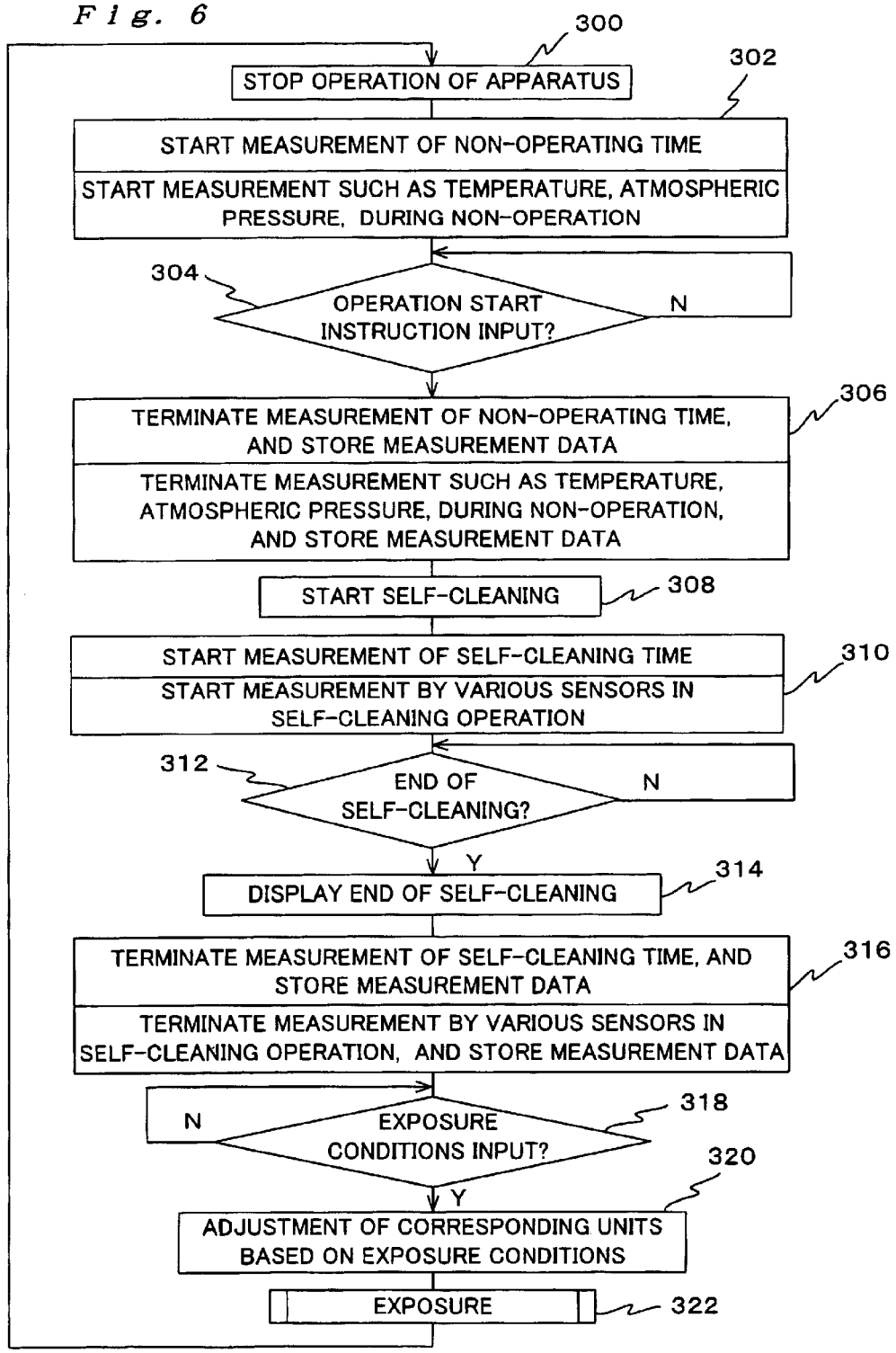
FIG. 6 is a flow chart showing a sequence from when the operation of the exposure apparatus of the third embodiment is stopped to when the apparatus is started to transfer a reticle pattern onto a predetermined number of (M) wafers W, and when the operation of the apparatus is stopped again.

FIG. 5 shows the schematic arrangement of an exposure apparatus 10' according to the third embodiment. This exposure apparatus 10' is a scanning exposure apparatus based on the step-and-scan method, which uses an ArF excimer laser light source (oscillation wavelength: 193 nm) as an exposure light source. The basic arrangement of the exposure apparatus 10' is the same as that of the exposure apparatus 10 described above. However, this embodiment differ on the point that it further includes an internal environment sensor 53 for measuring a predetermined physical quantity in a lens chamber within a projection optical system PL, and an external environment sensor 49 for measuring a predetermined physical quantity in a chamber 11 outside the projection optical system PL. This embodiment also differ in the exposure amount control method, and the manner in which transmittance, being the base of exposure amount control, is obtained. Therefore, these points will be mainly described below.

As the internal environment sensor 53, a sensor assembly structured of a pressure sensor to measure the pressure within the lens chamber and a gas sensor to measure the $CO_2$ concentration, is used. As the external environment sensor 49, a sensor assembly structured of a temperature sensor to measure the temperature within the chamber 11 and a humidity sensor to measuring the humidity within the chamber 11, is used. Output from the external environment sensor 49 and the internal environment sensor 53 are supplied to the main controller 50.

The arrangements of other portions are identical to those in the first embodiment except for the arrangement of the main controller 50 and its function associated with the exposure amount control (to be described next).

Next, with the exposure apparatus 10' of the third embodiment, the sequence in which the operation is stopped, and then performs the next operation of transferring the reticle pattern on a predetermined number of (M; for example, M=100) wafers W and is stopped again will be described. The description will be made with reference to the flow charts in FIGS. 6 and 7.

In this case, the main controller 50 is to be mainly configured of three processors, i.e., the first, second, and third processors. Of these processors, the second processor has the function of repeatedly sampling measurement values from the external environment sensor 49, the internal environment sensor 53, the integrator sensor 46, and the like at intervals of a predetermined time Δt, e.g., one minute, and recording the data results in a predetermined area in the memory 51, together with the sampling time. The third processor has the function of calculating predictive values of the transmittance change of the optical system at a interval of a predetermined time Δt1. The first processor is the main processor to perform processing in accordance with the control algorithm shown in the flow charts of FIGS. 6 and 7.

First, when the operation of the apparatus is stopped in step 300, the flow advances to step 302 to start the measurement of the elapsed time. The elapsed time from when the operation of the apparatus is stopped (non-operating time) is measured with a timer (not shown in Figs.), and the results are stored in a temporary storage area in the RAM. Measurement of the temperature and humidity in the chamber 11, as well as the measurement of atmospheric pressure and $CO_2$ concentration in the lens chamber is also performed.

In the next step 304, the flow awaits an input of instructions to start operation. During the interval when the apparatus is not operating, the second processor continues to store the measurement values from the external environment sensor 49 and internal environment sensor 53 in the memory 51, together with the corresponding time, at an interval of 1-min. When the instructions to start operation is input, the flow then advances to step 306, to terminate measurement of the elapsed time during operation stop and measurement of the temperature and humidity in the chamber 11, as well as the pressure and $CO_2$ concentration in the lens chamber. More specifically, the time when the instructions to start operation is input is measured with a timer (not shown in Figs.), and the result is stored in a temporary storage area in the RAM. The data of the time stored in steps 302 and 306 and the measurement values obtained by the external environment sensor 49 and internal environment sensor 53 which correspond to these times, are supplied from the memory 51. And then, they are stored in a predetermined area (hereinafter to be referred to as a first measurement data storage area) in the RAM.

In the next step 308, after an X-Y stage 14 is moved to position an irradiation amount monitor 59 immediately below the projection lens PL, the light source 16 starts the laser oscillation, and a shutter 16f is opened to start self-cleaning (break-in). Simultaneously, the time measured by the timer (not shown in Figs.) when self-cleaning is started in step 110 is stored in a temporary storage area in the RAM, so as to start measurement of an elapsed time of self-cleaning and measurement by various sensors. In this case, self-cleaning is performed because the transmittance variation of the optical system decreases as the amount of exposure light supplied to the optical system increases. By performing self-cleaning, therefore, the transmittance variation of the optical system in exposure operation can be reduced.

Next, in step 312, the flow waits for the completion of self-cleaning. The judgement of whether the self-cleaning has been completed is as follows. That is, during self-cleaning, the ratio between the output from the integrator sensor 46 and the output from the irradiation amount monitor 59 changes upon measurement. And when the changing amount becomes zero or reaches a predetermined level, then it is judged that the self-cleaning has been completed. In addition, during this self-cleaning, the second processor stores the measurement values obtained by the integrator sensor 46, external environment sensor 49, and internal environment sensor 53 in the memory 51, together with the corresponding time, at a 1-min interval.

When the self-cleaning is judged to be completed as described above, the flow then advances to step 314 to close the shutter 16f and shows the information indicating the end of self-cleaning on a display (not shown in Figs.). The flow advances to step 316, to terminate the measurement of an elapsed self-cleaning time and the measurement by each sensor during self-cleaning. More specifically, the time measured by a timer (not shown) at the time when the shutter 16f is closed is stored in a temporary storage area in the RAM. The we data of the time stored in steps 310 and 316 and the measurement values obtained by the integrator sensor 46, the external environment sensor 49 and internal environment sensor 53 which correspond to these times, are supplied from the memory 51. And then, they are stored in a predetermined area (hereinafter to be referred to as a second measurement data storage area) in the RAM.

In the next step 318, the flow awaits the input of exposure conditions. The operator uses an input/output unit 62 (see FIG. 1) such as a console to input exposure conditions. The exposure conditions include illumination conditions (the numerical aperture (N.A.) of the projection optical system, the coherence factor σ, the type of reticle pattern (contact hole, line-and-space, or the like), the transmittance of the reticle, the type of reticle (phase shift reticle, halftone reticle, or the like), the minimum line width or permissible exposure amount error, and the like. The flow then advances to step 320 to set the aperture stop (not shown in Figs.) of the projection optical system PL, select and sets the aperture of the illumination system aperture stop plate 24, selects the attenuation filter of a rough energy adjuster 20, sets a target exposure amount corresponding to the resist sensitivity. A series of preparatory operations, e.g., reticle loading, reticle alignment, and baseline measurement follow. And then, upon completing these procedures, the flow advances to the subroutine in step 322 for exposure. In this case, the reticle transmittance is measured in advance as follows. That is, pulse light is emitted from the light source 16, and the shutter 16f is opened to irradiate the reticle R with the exposure light EL. Both the output from the integrator sensor 46 and the reflected light monitor 47 are supplied, and the ratio between the output is multiplied by a predetermined correlation coefficient. The product is then subtracted from 1 and multiplied by 100, thereby obtaining the transmittance Rt (%) of the reticle R. The X-Y stage 14 is located at a predetermined loading position away from the position immediately below the projection optical system PL. Since the X-Y stage does not exist immediately below the projection optical system PL, the reflected light from below the projection optical system PL can be regarded as negligibly small in amount.

Figure 7:
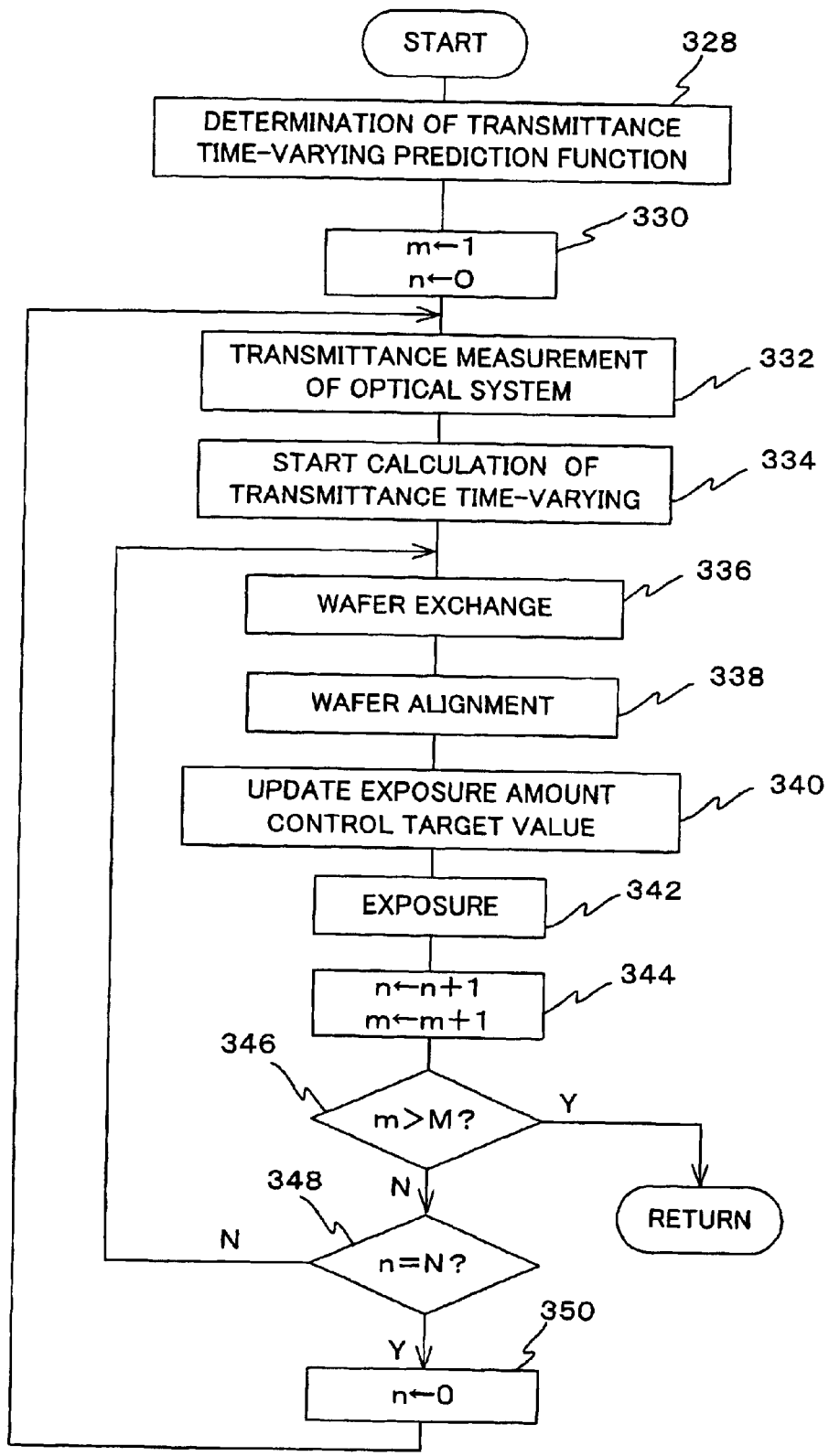
FIG. 7 is a flow chart showing the subroutine in step 322 in FIG. 6.

In the subroutine in step 322, as shown in FIG. 7, in step 328, based on the data in the first and second measurement data storage areas in the RAM and the corresponding exposure conditions, a transmittance time-varying prediction function for the optical system (structured by relay lenses 28A and 28B, a condenser lens 32, and the projection lens PL) is determined. And, the determined prediction function is supplied to the third processor. More specifically, the prediction function is determined by obtaining the irradiation history of exposure light on the optical system by using the data in the first and second measurement data storage areas in the RAM. Based on the irradiation history and the measurement values obtained by the sensors during the non-operating interval of the apparatus and the self-cleaning interval, a parameter a in equation (1) below is then WI determined. Also, based on the exposure conditions input in step 318, a parameter $b_i$ (i=1, 2, ..., k) in equation (1) below is determined.

$$T = a \cdot \exp\left(\sum_{i=1}^{k} b_i t\right) \quad (1)$$

T is the transmittance of the optical system, i.e., the ratio between the illuminance of exposure light emitted from the light source and the illuminance of exposure light having passed through a substrate surface, a is a parameter representing a varying rate, and $b_i$ is a parameter dependent on illumination conditions such as the attenuation ratio and the coherence factor σ.

In step 330, the count value m of the first counter indicating the number of wafers exposed and the count value n of the second counter indicating the number of wafers corresponding to transmittance measurement intervals, which will be described later, are respectively initialized to "1" and "0". In this case, the transmittance measurement is performed every time one lot, i.e., 25 wafers, is exposed, i.e., N=25 (to be described later).

In step 332, the transmittance of the optical system is measured as follows. The X-Y stage 14 is driven via a wafer stage driving portion 56 to position the irradiation amount monitor 59 immediately below the projection lens PL, and the shutter 16f is opened. The ratio between the output from the integrator sensor 46 and the irradiation amount monitor 59, is multiplied by 100 and a predetermined coefficient. If an unevenness sensor is to be used in place of the irradiation amount monitor 59, the unevenness sensor needs to be positioned on the optical axis of the projection optical system PL to perform transmittance measurement.

In the next step 334, the transmittance measurement result is supplied to the third processor, and an instruction to start the prediction calculation of the transmittance time-varying is sent. With this operation, by using the supplied transmittance as an initial value, the third processor starts prediction calculation of the transmittance time-varying at a predetermined interval of Δt1. The calculation results are sequentially updated and stored in a predetermined area (to be referred to as a "transmittance data storage area" for the sake of convenience) in the memory 51 by the third processor.

In step 336, instructions are sent to a wafer transfer system (not shown in Figs.) to exchange the wafer W. Wafer exchange is performed by the wafer transfer system and a wafer loading/unloading mechanism (not shown) on the X-Y stage (if no wafer is present on the stage, merely wafer loading is performed). In step 338, a series of alignment processes such as a so-called search alignment and fine alignment (e.g., the above EGA) is performed. Such wafer exchange and wafer alignment is performed in the manner similar as in a known exposure apparatus.

In the next step 340, the latest predictive calculation value of transmittance at this stage is supplied from the transmittance data storage area in the memory 51, and the exposure amount control target value is updated based on the transmittance. The flow then advances to step 342 to transfer a reticle pattern onto a plurality of shot areas on the wafer W by the step-and-scan method. The operation of moving the wafer W to a scanning start position for exposure on each shot area on the wafer W and the scanning exposure is thus repeated, based on the alignment results in step 338 and the predetermined shot map data. During the scanning exposure, the exposure amount control is performed as described above in accordance with the exposure control target value corresponding to the transmittance and the output from the integrator sensor 46.

When exposure on the mth (first in this case) wafer W is completed as described above, the flow advances to step 344 to increment the above count values m and n of the first and second counters by one (n←n+1, m←m+1).

In the next step 346, it is then checked whether the count value m has exceeded a predetermined number M of wafers to be processed. In the case of completing exposure of the first wafer, since m=2, the result is negative in step 346. The flow therefore advances to step 348 to check whether the count value n is N, i.e., 25. On completing the first exposure, since n=1, the result is also negative in step 348. The flow, therefore, returns to step 336 to repeat the above processing/judgement.

When exposure on the 25th wafer is completed, n=25=N, and the result becomes affirmative in step 348. The flow then advances to step 350, and after resetting the second counter (n←0), returns to step 332 to measure the transmittance of the optical system as described above. The measurement result is supplied as an initial value to the third processor, and instructions are sent to start the prediction calculation of the transmittance time-varying. In this manner, according to this embodiment, by supplying the actual measurement data of transmittance which is measured each time exposure on one lot of wafers is completed as an initial value to the third processor, an error in the transmittance prediction result by calculation can be corrected.

Subsequently, the processing/judgement is repeated, and each time exposure of 25 wafers is completed, the transmittance of the optical system is repeatedly measured. And, when exposure on the Mth wafer W is completed, the result in step 346 becomes affirmative, and the flow returns to step 300 in the main routine in FIG. 6. Stopping the operation of the apparatus in step 300 means that the light source 16 is turned off, and an instruction to complete the measurement is sent to the third processor. In accordance with this instruction, the third processor terminates the transmittance time-varying prediction calculation.

As is obvious from the description above, according to the third embodiment, the function of the main controller 50 incorporates the exposure amount setting unit, the exposure amount control system, and the computation unit.

As described above, according to the third embodiment, the transmittance time-varying prediction function of the optical system is determined in accordance with the irradiation history of exposure light on the optical system (constituted by the relay lenses 28A and 28B, condenser lens 32, and projection lens PL) and the actual exposure conditions. And in accordance with this transmittance time-varying prediction function, the exposure amount is predictively controlled. Therefore, the pattern on the reticle R can be transferred onto the wafer w by using the optical system while the image plane illuminance (wafer surface illuminance) is set at an almost desired value. Thus, high-precision exposure can be achieved without being influenced by changes in the transmittance of the optical system.

In addition, since the transmittance is measured each time exposure of one lot is completed a high throughput can be maintained, compared with the case in which transmittance time-varying characteristics are determined by measuring the transmittance prior to exposure on each wafer. Furthermore, the transmittance time-varying prediction result is corrected each time the transmittance is measured, which is different from the case in which the transmittance is obtained only by calculation. That is, errors occurring in between the predicted exposure amount values and the actual transmittance measurement is corrected by lots, thus performing exposure amount control with a higher accuracy.

The third embodiment has exemplified an exposure amount control method, in which the oscillation frequency (emission timing), emission energy, or the like of the light source 16 is controlled. Also, the case in which the attenuation ratio of the rough energy adjuster 20 is adjusted to provide the wafer W with the target integrated exposure amount determined in accordance with exposure conditions and resist sensitivity in scanning exposure has been described. In this case, as well, similar to the first and second embodiments, on scanning exposure, the exposure amount may be adjusted by changing the scanning velocities of the reticle stage RST and the X-Y stage 14. The so-called slit width may also be changed, or adjustment of scanning velocities and adjustment of a slit width may be combined. During these adjustments, however, the power of the light source 16 and the velocity ratio between the reticle stage RST and the X-Y stage 14 is to be kept constant.

In either case, the illuminance of a wafer surface is influenced by changes in the transmittance of the projection lens PL and the like. Therefore, in order to cancel out this influence and always provide the wafer W with a target exposure amount, the exposure amount control target value (a control target value such as a pulse oscillation frequency, pulse energy, attenuation ratio, scanning velocity, or slit width) is required to be updated.

With the third embodiment, the main controller 50 described to be structured of the first, second, and third processors. However, the functions of the first to third processors may be implemented by using the stage controller, exposure controller, lens controller, and the like which are controlled by the microcomputer or workstation which structure the main controller, by multitask processing or time-divisional processing.

According to the third embodiment, the case in which the transmittance of the optical system is repeatedly measured in units of lots has been described. However, when exposure is to be continuously performed, since the change in transmittance of the projection lens PL and the like is not uniform, the optical system transmittance measurement intervals may be automatically changed in accordance with the manner in which the transmittances change, as in the second embodiment.

In the embodiments above, one lot was defined to have 25 wafers. However, one lot may have 50 or 100 wafers.

Also, in the embodiments above, the transmittance time-varying prediction function for the optical system is determined in accordance with the irradiation history of exposure and exposure conditions. If, however, the exposure conditions in self-cleaning are the same as the exposure conditions after the exposure has started, the transmittance time-varying prediction function may be determined only in accordance with the irradiation history, regardless of the exposure conditions.

According to each embodiment described above, the transmittance measurement is performed after a predetermined number of wafers are exposed. Obviously, however, the present invention is not limited to this, and the transmittance measurement may be performed after a predetermined number of shots are exposed.

As described above, the exposure apparatus of each embodiment described above is made by assembling various subsystems including elements defined in the claims of the present application so as to keep a predetermined mechanical precision, electrical precision, and optical precision. In order to ensure the precision, various optical systems, various mechanical systems, and various electrical systems are adjusted to attain a predetermined optical precision, mechanical precision, and electrical precision, respectively, prior to and after this assembly. The process of incorporating various subsystems into an exposure apparatus includes mechanical connection of various subsystems, by wiring electrical circuits, piping pressure circuits, and the like. Obviously, before the process of incorporating various subsystems into an exposure apparatus, the process of assembling the respective subsystem is performed. After the process of assembling various subsystems into the exposure apparatus, total adjustment is performed to ensure preciseness in the overall exposure apparatus. The exposure apparatus is preferably made in a clean room in which temperature, degree of cleanliness, and the like are controlled.

With each embodiment described above, the present invention is applied to a scanning exposure apparatus based on the step-and-scan method. However, the application range of the present invention is not limited to this, and the present invention can be suitably applied to a static type exposure apparatus such as a stepper.

Also, in each embodiment described above, the present invention is applied to an exposure apparatus in which excimer laser light such as ArF excimer laser light (wavelength: 193 nm), KrF excimer laser light (wavelength: 248 nm), or $F_2$ laser light (wavelength: 157 nm) is used as the exposure light EL. However, the present invention can be suitably applied to an exposure apparatus using vacuum ultraviolet light such as $Kr_2$ laser light having a wavelength of 146 nm or $Ar_2$ laser light having a wavelength of 126 nm.

Furthermore, a harmonic, which is obtained by amplifying a single-wavelength laser beam in the infrared or visible range being emitted by a DFB semiconductor laser or fiber laser with a fiber amplifier doped with erbium(or both erbium and ytteribium), and converting the wavelength into ultraviolet light using a nonlinear optical crystal, may also be used.

If, for example, the oscillation wavelength of a single-wavelength laser is set within the range of 1.51 to 1.59 $\mu$m, an eighth-harmonics whose generation wavelength falls within the range of 189 to 199 nm or a tenth-harmonics whose generation wavelength falls within the range of 151 to 159 nm is output. If the oscillation wavelength is set in the range of 1.544 to 1.553 $\mu$m, in particular, an eighth-harmonics whose generation wavelength falls within the range of 193 to 194 nm, i.e., ultraviolet light having almost the same wavelength as that of an ArF excimer laser beam, can be obtained. If the oscillation wavelength is set within the range of 1.57 to 1.58 $\mu$m, a tenth-harmonics whose generation wavelength falls within the range of 157 to 158 nm, i.e., ultraviolet light having almost the same wavelength as that of an $F_2$ laser beam, can be obtained.

If the oscillation wavelength is set within the range of 1.03 to 1.12 $\mu$m, a seventh-harmonics whose generation wavelength falls within the range of 147 to 160 nm is output. If the oscillation wavelength is set within the range of 1.099 to 1.106 $\mu$m, in particular, a seventh-harmonics whose generation wavelength falls within the range of 157 to 158 $\mu$m, i.e., ultraviolet light having almost the same wavelength as that of an $F_2$ laser beam, can be obtained. In this case, as a single-wavelength oscillation laser, for example, an ytteribium-doped fiber laser can be used.

The projection optical system and the illumination optical system described according to the first to third embodiment is an example, therefore, the present invention is not limited to this. For instance, as the projection optical system, not only can the refraction optical system be employed, but also a reflection system structured by only reflection optical elements can be employed. The present invention can also be applied to a reflection/refraction system (catadioptric system) including reflection optical elements and refraction optic elements as a projection optical system. For example, in an exposure apparatus using a vacuum ultraviolet light (VUV light) having a wavelength of about 200 nm or less, a reflection/refraction system may be used as a projection optical system. In this case, as a reflection/refraction type projection optical system, the following system can be used: a reflection/refraction system having a beam splitter and concave mirror as reflection optical elements, which is disclosed in, for example, Japan Patent Laid Open No. 08-171054, U.S. Pat. No. 5,668,672 corresponding thereto, Japan Patent Laid Open No. 10-20195, and U.S. Pat. No. 5,835,275 corresponding thereto, or a reflection/refraction system having a concave mirror and the like as reflection optical elements without using any beam splitter, which his disclosed in, for example, Japan Patent Laid Open No. 8-334695, U.S. Pat. No. 5,689,377 corresponding thereto, Japan Patent Laid Open No. 10-3039, and U.S. patent application No. 873,605 (application date: Jun. 12, 1997) corresponding thereto. The above disclosures are fully incorporated by reference herein.

In addition, the reflection/refraction system disclosed in U.S. Pat. Nos. 5,031,976, 5,488,229, and 5,717,518 may be used. In the disclosure, a plurality of refraction optic elements and two mirrors (a main mirror which is a concave mirror, and a sub-mirror which is a rear mirror having a reflecting surface formed on a surface of a refraction element or plane-parallel plate which is located on the opposite side of the incident surface) are arranged coaxially, and an intermediate image of a reticle pattern formed by the plurality of refraction optic elements re-formed on a wafer by the main mirror and sub-mirror. In this reflection/refraction system, the main mirror and sub-mirror are arranged following the plurality of refraction optic elements, and illumination light passes through a portion of the main mirror to be sequentially reflected by the sub-mirror and main mirror, and reaches the wafer through a portion of id the sub-mirror. The above disclosures are fully incorporated by reference herein.

In the present invention, a variation in the transmittance of the optical system means a variation in the amount of exposure light passing through the respective C.) optical elements (lenses 28A, 28B, and 32, projection lens PL, and the reflecting surface of the mirror M) arranged between the integrator sensor 46 and the illuminance sensor 59. Therefore, the transmittance of the optical system in the present invention includes, for example, a variation in the reflectance of the mirror M in FIGS. 1 and 5.

Also, as the projection optical system, in the case of employing a reflection system or a reflection/refraction system, it is a matter of course that the transmittance of the optical system in the present invention includes the reflectance of the reflection mirrors.

And, in addition to exposure apparatus used to manufacture semiconductor devices, obviously, the present invention can be applied to exposure apparatus for transferring device patterns onto glass plates, which are used to manufacture displays including liquid crystal display devices. It also can be applied to exposure apparatus for transferring device patterns onto ceramic wafers, which is used to manufacture thin-film magnetic heads, and an exposure apparatus used to manufacture image sensing devices (CCDs and the like), and the like.

Device Manufacturing Method

A device manufacturing method using the above exposure apparatus and method in a lithographic process will be described in detail next.

Figure 8:
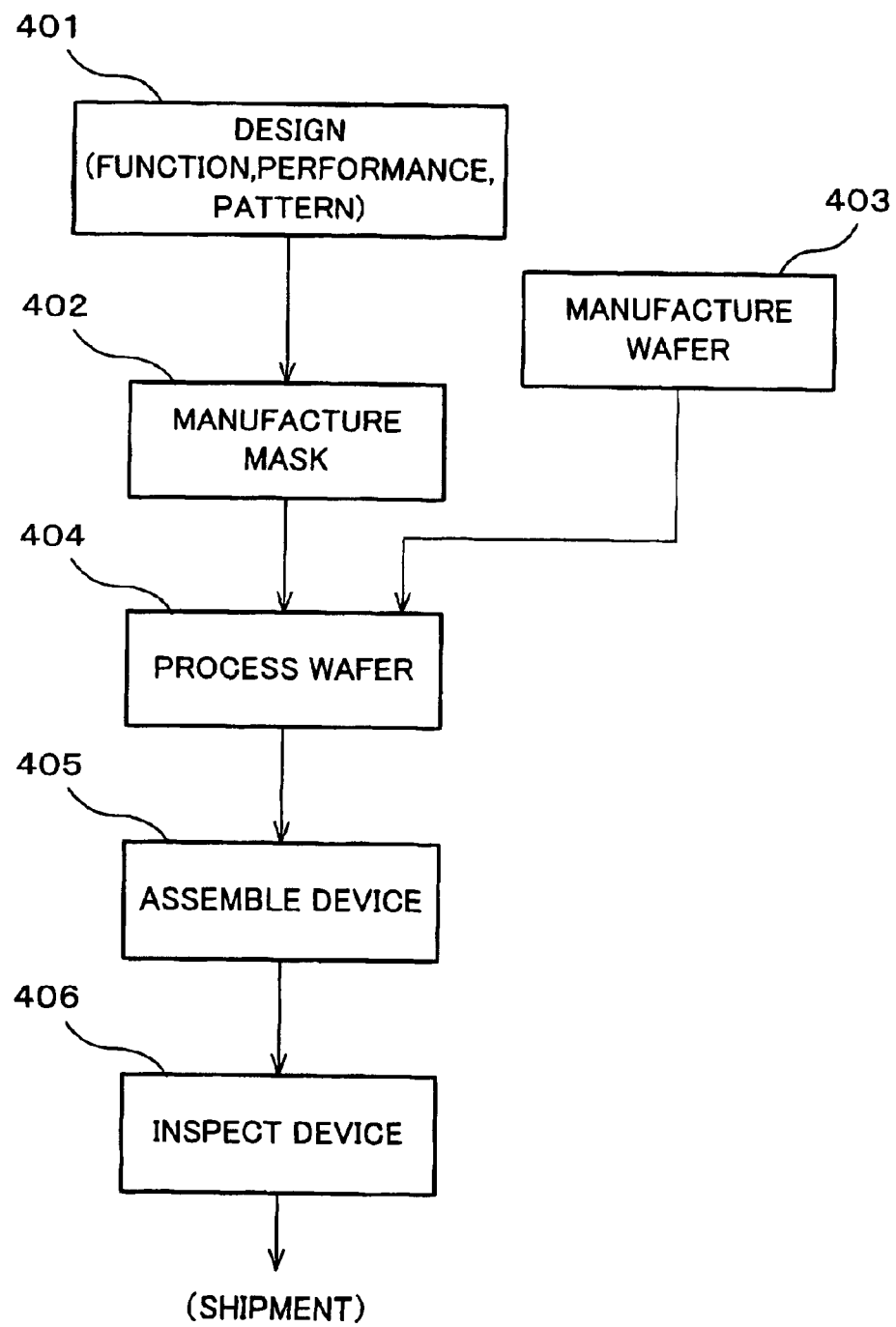
FIG. 8 is a flow chart for explaining an embodiment of a device manufacturing method according to the present invention.

FIG. 8 is a flow chart showing an example of manufacturing a device (a semiconductor chip such as an IC or LSI, a liquid crystal panel, a CCD, a thin magnetic head, a micromachine, or the like). As shown in FIG. 8, in step 401 (design step), function/performance is designed for a device (e.g., circuit design for a semiconductor device) and a pattern to implement the function is designed. In step 402 (mask manufacturing step), a mask on which the designed circuit pattern is formed is manufactured. In step 403 (wafer manufacturing step), a wafer is manufacturing by using a silicon material or the like.

In step 404 (wafer processing step), an actual circuit and the like are formed on the wafer by lithography or the like using the mask and wafer prepared in steps 401 to 403, as will be described later. In step 405 (device assembly step), a device is assembled by using the wafer processed in step 404. Step 405 includes processes such as dicing, bonding, and packaging (chip encapsulation).

Finally, in step 406 (inspection step), a test on the operation of the device, durability test, and the like are performed. After these steps, the device is completed and shipped out.

Figure 9:
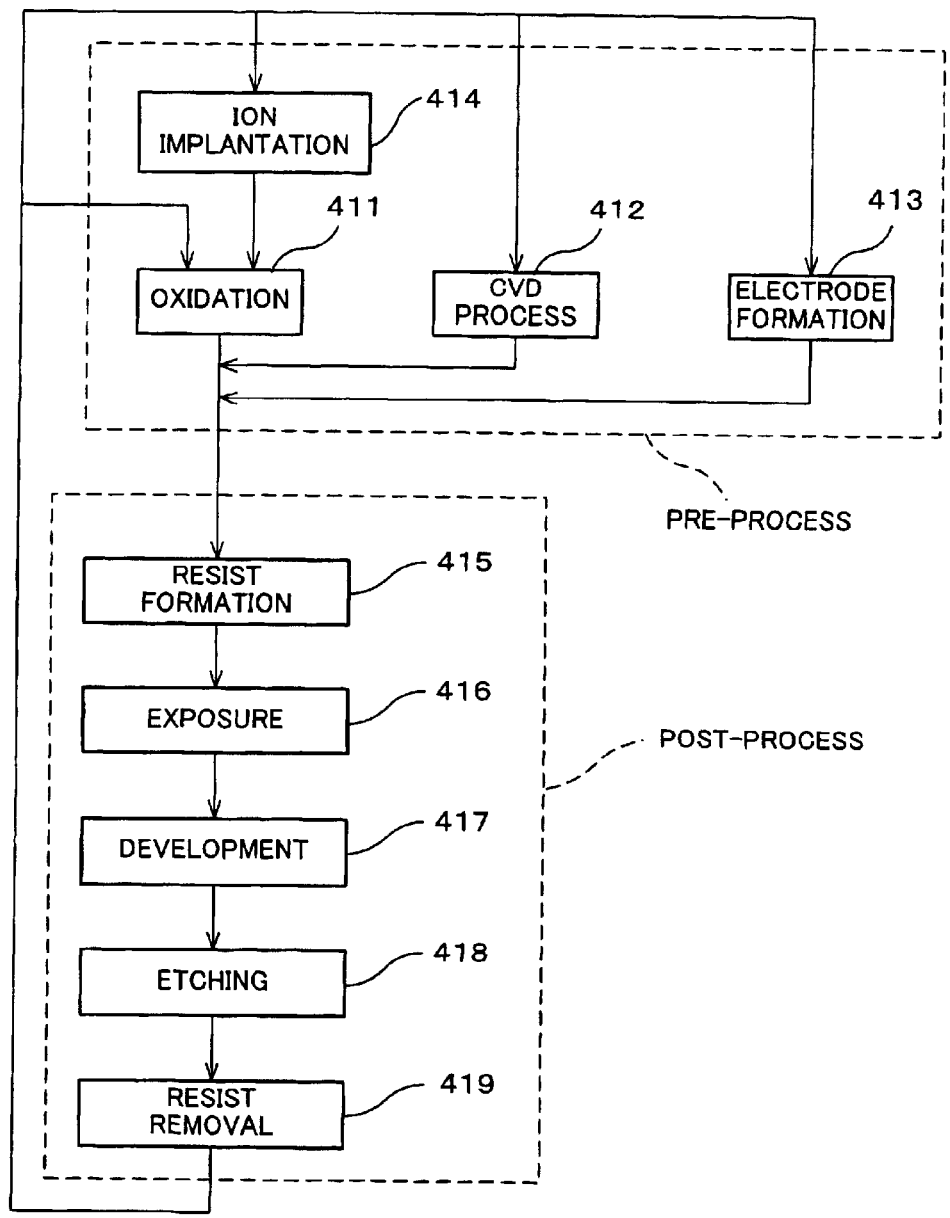
FIG. 9 is a flow chart showing the processing in step 404 in FIG. 8.

FIG. 9 is a flow chart showing a detailed example of step 404 described above in manufacturing the semiconductor device. Referring to FIG. 9, in step 411 (oxidation step), the surface of the wafer is oxidized. In step 412 (CVD step), an insulating film is formed on the wafer surface. In step 413 (electrode formation step), an electrode is formed on the wafer by vapor deposition. In step 414 (ion implantation step), ions are implanted into the wafer. Steps 411 to 414 described above constitute a pre-process for the respective steps in the wafer process and are selectively executed in accordance with the processing required in the respective steps.

When the above pre-process is completed in the respective steps in the wafer process, a post-process is executed as follows. In this post-process, first, in step 415 (resist formation step), the wafer is coated with a photosensitive agent. Next, as in step 416, the circuit pattern on the mask is transcribed onto the wafer by the above exposure apparatus and method. Then, in step 417 (developing step), the exposed wafer is developed. In step 418 (etching step), an exposed member on a portion other than a portion where the resist is left is removed by etching. Finally, in step 419 (resist removing step), the unnecessary resist after the etching is removed.

By repeatedly performing these pre-process and post-process, multiple circuit patterns are formed on the wafer.

As described above, by using the device manufacturing method of this embodiment, the exposure apparatus and exposure method described in each embodiment above are used in the exposure process (step 416). This makes it possible to improve the controllability of the line width due to improvement of the accuracy of exposure amount control, which if in turn improves the exposure preciseness including the overlay accuracy. Thus, high-integration microdevices with a high yield can be manufactured.

While the above-described embodiments of the present invention are the presently preferred embodiments thereof, those skilled in the art of lithography systems will readily recognize that numerous additions, modifications and substitutions may be made to the above-described embodiments without departing from the spirit and scope thereof. It is intended that all such modifications, additions and substitutions fall, within the scope of the present invention, which is best defined by the claims appended below.

What is claimed is:

1. An exposure method to transfer a pattern of a mask illuminated with exposure light from a light source onto a substrate through an optical system, said method comprising:

setting an exposure condition for transferring said pattern of said mask onto said substrate;

setting a time interval for obtaining both of a detection result of a part of said exposure light between said light source and said mask and a detection result of said exposure light having passed through said optical system, based on said set exposure condition;

setting an exposure amount control target value with respect to said substrate based on both of said obtained detection results; and transferring said pattern onto said substrate through said optical system, while an exposure amount of said exposure light with respect to said substrate is controlled based on the detection result of a part of said exposure light detected between said light source and said mask and said set exposure amount control target value, wherein said time interval is changed when the setting of said exposure condition is changed.

2. An exposure method according to claim 1, wherein said exposure condition includes a transmittance of said mask.

3. An exposure method according to claim 1, wherein said exposure condition includes one of a minimum line width of said pattern and a permissible exposure amount error.

4. A device manufacturing method including a lithographic process, wherein exposure is performed in said lithographic process by using said exposure method according to claim 1.

5. An exposure method according to claim 1, wherein a part of said exposure light is branched away from said exposure light by a branch optical system arranged between said light source and said mask, and said optical system includes a plurality of optical elements arranged between said branch optical system and said substrate.

6. An exposure method according to claim 5, wherein said optical system includes a part of an illumination optical system to illuminate said mask and a projection optical system to transfer said pattern onto said substrate.

7. An exposure method according to claim 6, wherein a transmittance of said optical system is obtained based on a ratio between said both detection results.

8. An exposure method according to claim 1, wherein a change of a transmittance of said optical system is calculated based on both of said detection results obtained at said set time interval.

9. An exposure method to illuminate a mask with exposure light from a light source and transfer a pattern of the mask onto a substrate through an optical system, said method comprising:

setting time intervals each corresponding to at least two exposure conditions for transferring said pattern of said mask onto said substrate, said time intervals being for obtaining both detection results of a part of said exposure light between said light source and said mask and of said exposure light having passed through said optical system;

storing said set time intervals in a memory;

setting one exposure condition of said at least two exposure conditions;

calling up said time interval corresponding to the set one exposure condition from the memory;

obtaining both detection results of a part of said exposure light between said light source and said mask and of said exposure light having passed through said optical system, based on the called up time interval; and controlling an exposure amount of said exposure light with respect to said substrate based on said obtained both detection results.

10. An exposure method according to claim 9, wherein said at least two exposure conditions include at least one of an illumination condition to illuminate said mask, a transmittance of said mask, a minimum line width of a pattern formed on said mask, and a permissible exposure amount error of said exposure light with respect to said substrate.

11. An exposure method according to claim 9, wherein said optical system includes a part of an illumination optical system to illuminate said mask and a projection optical system to transfer said pattern onto said substrate.

12. An exposure method according to claim 9, further comprising:
obtaining a transmittance of said optical system by multiplying a ratio between a part of said exposure light detected between said light source and said mask and said exposure light having passed through said optical system by a predetermined coefficient.

13. A device manufacturing method including a lithographic process, wherein exposure is performed in said lithographic process by using said exposure method according to claim 9.

14. An exposure method to transfer a pattern illuminated with exposure light from a light source onto a substrate through an optical system, said method comprising:
performing a first measurement in which both of an amount of a part of said exposure light between said light source and said mask and an amount of said exposure light having passed through said optical system are measured;
performing a second measurement in which both of an amount of a part of said exposure light between said light source and said mask and an amount of said exposure light having passed though said optical system are measured at a predetermined time interval after said first measurement;
comparing a transmittance of said optical system obtained based on a ratio between the amount of a part of said exposure light and the amount of said exposure light having passed through said optical system measured in said first measurement and a transmittance of said optical system obtained based on a ratio between the amount of a part of said exposure light and the amount of said exposure light having passed through said optical system measured in said second measurement; and
obtaining a time interval for measurement for measuring both of an amount of a part of said exposure light between said light source and said mask and an amount of said exposure light having passed through said optical system in third and succeeding measurements, in accordance with the comparison result.

15. An exposure method according to claim 14, wherein said first and second measurements are performed prior to starting of exposure.

16. An exposure method according to claim 14, wherein said first and second measurements are performed after starting of exposure.

17. A device manufacturing method including a lithographic process, wherein exposure is performed in said lithographic process by using said exposure method according to claim 14.

18. An exposure method according to claim 14, wherein said optical system includes a part of an illumination optical system to illuminate said mask and a projection optical system to transfer said pattern onto said substrate.

19. An exposure method according to claim 14, wherein a transmittance of said optical system is obtained by multiplying a ratio between an amount of a part of said exposure light measured between said light source and said mask and an amount of said exposure light having passed through said optical system by a predetermined coefficient.

20. An exposure method performed by an exposure apparatus to transfer a pattern illuminated with exposure light from a light source through an optical system onto a substrate, said method comprising:
a self-cleaning to clean said optical system by irradiating said optical system with said exposure light before transferring said pattern onto said substrate;
monitoring an amount of said exposure light irradiated on said optical system between said light source and said mask, while performing said self-cleaning;
a prediction function determining to determine a transmittance time-varying prediction function of said optical system in consideration of the monitored amount of said exposure light; and
setting said exposure amount control target value based on said determined transmittance time-varying prediction function.

21. An exposure method according to claim 20, wherein said prediction function determining takes into consideration a period of time in which the operation of said apparatus is stopped.

22. An exposure method according to claim 20, wherein an irradiation time of said exposure light on said optical system is further taken into consideration when determining said transmittance time-varying prediction function.

23. A device manufacturing method including a lithographic process, wherein exposure is performed in said lithographic process by using said exposure method according to claim 20.

24. An exposure method according to claim 20, wherein said time-varying function is a function expressed by $$T = a \cdot \exp\left(\sum_{i=1}^{k} b_i t\right)$$

in which T is said transmittance of said optical system, "a" is a parameter representing a rate of change in said transmittance, and $b_i$ is a parameter dependent on each exposure condition including an illumination condition.

25. An exposure method according to claim 20, further comprising prior to said prediction function determining:
measuring a period of time in which said exposure apparatus most recently stops operation;
measuring an irradiation time of exposure light on said optical system in a self-cleaning operation which is performed after said exposure apparatus most recently stops operation;
measuring an exposure light intensity; and
measuring an irradiation amount.

26. An exposure method according to claim 20, wherein environmental conditions for said optical system are measured at a predetermined time interval, and said environmental conditions are considered when transmittance time-varying prediction function is determined.

27. An exposure method according to claim 20, further comprising:
measuring a transmittance of said optical system at a predetermined time interval, and correcting said transmittance time-varying prediction function each time a transmittance measurement is performed.

28. An exposure method according to claim 27, wherein said predetermined time interval of said measuring said transmittance is determined in respect to a relationship with a required exposure precision.

29. An exposure method according to claim 27, wherein said time interval of said measuring said transmittance is
   short when a rate of change in said transmittance of said optical system is large, and
   long when said rate of change in said transmittance of said optical system is small.

30. An exposure method according to claim 20, wherein a transmittance of said optical system is obtained by multiplying a ratio between an amount of a part of said exposure light measured between said light source and said mask and an amount of said exposure light having passed through said optical system by a predetermined coefficient.

31. An exposure apparatus to transfer a pattern illuminated with exposure light from a light source onto a substrate, said exposure apparatus comprising:
   a branch optical system arranged within an illumination optical system illuminating said pattern and configured to branch a part of said exposure light;
   an optical system arranged between said branch optical system and said substrate;
   a first sensor arranged within said illumination optical system and configured to detect a part of said exposure light branched by said branch optical system;
   a second sensor arranged flush with a surface on which said substrate is arranged and configured to detect said exposure light having passed through said optical system;
   a control unit connected with said first and second sensors and configured to set a time interval for obtaining both of an output from said first sensor and an output from said second sensor based on an exposure condition for transferring said pattern onto said substrate;
   an exposure amount setting unit connected with said control unit and configured to set an exposure amount control target value with respect to said substrate based on both of the output from said first sensor and the output from said second sensor; and
   an exposure amount control system connected with said exposure amount setting unit and configured to control an exposure amount based on said set exposure amount control target value, wherein
      said control unit changes said time interval when said exposure condition is changed.

32. An exposure apparatus according to claim 31, further comprising:
   an information reading unit configured to read information of a mask on which the pattern is formed, wherein said control unit automatically changes said set time interval based on said information of said mask read by said information reading unit.

33. An exposure apparatus according to claim 31, wherein said control unit changes said time interval in accordance with a transmittance of a mask on which said pattern is formed.

34. An exposure apparatus according to claim 31, wherein said control unit changes said time interval in accordance with one of a minimum line width of said pattern and a permissible exposure amount error.

35. An exposure apparatus according to claim 31, further comprising:
   a mask stage configured to hold a mask on which said pattern is formed; and
   a substrate stage configured to hold said substrate, wherein
      said optical system includes a part of said illumination optical system disposed between said branch optical system and said mask, and a projection optical system configured to project said exposure light which exits from said mask onto said substrate.

36. An exposure apparatus according to claim 35, further comprising:
   a driving unit connected with said mask stage and said substrate to synchronously move said mask stage and said substrate stage in a linear direction perpendicular to an optical axis of said projection optical system.

37. An exposure apparatus according to claim 31 further comprising:
   a transmittance measurement unit configured to obtain a transmittance of said optical system based on an output signal sent from said first sensor when photodetecting a part of said exposure light and an output signal sent from said second sensor when photodetecting said exposure light passing through said optical system.

38. An exposure apparatus according to claim 37, wherein a transmittance of said optical system is obtained based on a ratio between an output signal from said first sensor and an output signal from said second sensor.

39. A device manufactured by using said exposure apparatus according to claim 31.

40. An exposure apparatus according to claim 31, wherein said exposure condition includes an illumination condition to illuminate said mask, and the illumination condition includes one of a ring-shaped illumination and a modified illumination.

41. An exposure apparatus to transfer a pattern illuminated with exposure light from a light source onto a substrate, said exposure apparatus comprising:
   a branch optical system arranged within an illumination optical system illuminating said pattern and configured to branch a part of said exposure light;
   a first sensor arranged within said illumination optical system and configured to detect a part of said exposure light branched by said branch optical system;
   a second sensor arranged flush with a surface on which said substrate is arranged and configured to detect said exposure light having passed through said optical system;
   a measurement unit connected with said first and second sensors and configured to obtain both of an output from said first sensor and an output from said second sensor by a first measurement, and obtain again both of an output from said first sensor and an output from said second sensor in a next measurement at a predetermined time interval after the first measurement;
   a control unit connected with said measurement unit and configured to compare a transmittance of said optical system obtained based on the outputs from the first and second sensors measured in the first measurement and a transmittance of said optical system obtained based on the outputs from the first and second sensors measured in the next measurement, and to change said predetermined time interval in accordance with the comparison result;
   an exposure amount setting unit connected with said measurement unit and configured to set an exposure amount control target value based on both of the output from said first sensor and the output from said second sensor; and an exposure amount control system connected with said exposure amount setting unit and configured to control an exposure amount based on said set exposure amount control target value.

42. An exposure apparatus according to claim 41, wherein said measurement unit obtains both of the output from the first sensor and the output from the second sensor prior to starting of exposure.

43. An exposure apparatus according to claim 41, wherein said measurement unit obtains both of the output from the first sensor and the output from the second sensor after starting of exposure.

44. An exposure apparatus according to claim 41, wherein said exposure amount control system controls said exposure amount based on said exposure amount control target value and the output from said first sensor when transferring said pattern onto said substrate.

45. An exposure apparatus which comprises an exposure apparatus main body transferring a pattern illuminated with exposure light from a light source onto a substrate through an optical system, said exposure apparatus comprising:
- a self-cleaning unit provided at said exposure apparatus main body and configured to self-clean said optical system by irradiating said optical system with said exposure light before transferring said pattern onto said substrate;
- a first sensor arranged within an illumination optical system illuminating said pattern and configured to monitor an amount of said exposure light irradiated on said optical system while self-cleaning said optical system;
- a calculation unit connected with said first sensor and configured to determine a transmittance time-varying prediction function of said optical system in consideration of the result monitored by said first sensor; and
- an exposure amount setting unit connected with said calculation unit and configured to set an exposure amount control target value based on said determined transmittance time-varying prediction function.

46. A device manufactured by using said exposure apparatus according to claim 45.

47. An exposure apparatus according to claim 45, wherein said calculation unit further considers an irradiation time of said exposure light to said optical system when determining said transmittance time-varying prediction function.

48. An exposure apparatus according to claim 45, wherein said time-varying prediction function has a period of time in which the operation of said apparatus is stopped as a parameter.

49. An exposure apparatus to transfer a pattern illuminated with exposure light from a light source onto a substrate through an optical system, said exposure apparatus comprising:
- a first sensor arranged within an illumination optical system illuminating said pattern and configured to photodetect a part of said exposure light;
- a second sensor provided substantially flush with a surface on which said substrate is arranged and configured to photodetect said exposure light having passed through said optical system;
- a setting unit connected with said first and second sensors and configured to set time intervals each corresponding to a plurality of conditions for transferring said pattern onto said substrate, said time intervals being for obtaining both of an output signal from said first sensor and an output signal from said second sensor;
- a memory connected with said setting unit and configured to store said set time intervals so that said set time intervals respectively correspond to said plurality of conditions;
- a selection unit configured to select any exposure condition among a plurality of exposure conditions for transferring said pattern onto said substrate; and
- a control unit connected with said memory and said selection unit and configured to call up a time interval corresponding to said any exposure condition selected by said selection unit from the memory.

50. A device manufactured by using said exposure apparatus according to claim 49.

51. An exposure apparatus according to claim 49, wherein said exposure condition includes at least one of an illumination condition to illuminate said mask, a transmittance of said mask, a minimum line width of a pattern formed on said mask, and a permissible exposure amount error of said exposure light with respect to said substrate.

* * * * *